US009923284B1

(12) United States Patent
Loui et al.

(10) Patent No.: US 9,923,284 B1
(45) Date of Patent: Mar. 20, 2018

(54) EXTRAORDINARY ELECTROMAGNETIC TRANSMISSION BY ANTENNA ARRAYS AND FREQUENCY SELECTIVE SURFACES HAVING COMPOUND UNIT CELLS WITH DISSIMILAR ELEMENTS

(71) Applicant: National Technology & Engineering Solutions of Sandia, LLC, Albuquerque, NM (US)

(72) Inventors: Hung Loui, Albuquerque, NM (US); Bernd H. Strassner, II, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 139 days.

(21) Appl. No.: 14/925,045

(22) Filed: Oct. 28, 2015

(51) Int. Cl.
*H01Q 21/30* (2006.01)
*H01Q 21/00* (2006.01)
*G01R 23/00* (2006.01)

(52) U.S. Cl.
CPC ............. *H01Q 21/30* (2013.01); *G01R 23/00* (2013.01); *H01Q 21/0006* (2013.01)

(58) Field of Classification Search
CPC ..... H01Q 21/30; H01Q 23/00; H01Q 21/0006
USPC .......................................................... 343/853
See application file for complete search history.

(56) References Cited

U.S. PATENT DOCUMENTS 4,766,440 A * 8/1988 Gegan .................. H01Q 9/0428 343/700 MS
5,485,167 A * 1/1996 Wong ....................... H01Q 5/42 343/753
5,771,449 A * 6/1998 Biasing .................. H01Q 1/246 348/E7.07

(Continued)

OTHER PUBLICATIONS

Ebbesen, et al., "Extraordinary Optical Transmission Through Sub-Wavelength Hole Arrays", In Nature, vol. 391, Feb. 12, 1998, pp. 667-669.

(Continued)

*Primary Examiner* — Huedung Mancusco
(74) *Attorney, Agent, or Firm* — Medley, Behrens & Lewis, LLC

(57) ABSTRACT

The various embodiments presented herein relate to extraordinary electromagnetic transmission (EEMT) to enable multiple inefficient (un-matched) but coupled radiators and/or apertures to radiate and/or pass electromagnetic waves efficiently. EEMT can be utilized such that signal transmission from a plurality of antennas and/or apertures occurs at a transmission frequency different to transmission frequencies of the individual antennas and/or aperture elements. The plurality of antennas/apertures can comprise first antenna/aperture having a first radiating area and material(s) and second antenna/aperture having a second radiating area and material(s), whereby the first radiating/aperture area and second radiating/aperture area can be co-located in a periodic compound unit cell. Owing to mutual coupling between the respective antennas/apertures in their arrayed configuration, the transmission frequency of the array can be shifted (Continued)

from the transmission frequencies of the individual elements. EEMT can be utilized for an array of evanescent of inefficient radiators connected to a transmission line(s).

14 Claims, 26 Drawing Sheets

(56) References Cited

U.S. PATENT DOCUMENTS

| | | | | |
|---|---|---|---|---|
| 6,052,582 | A * | 4/2000 | Blasing .................. | H01Q 1/246<br>348/E7.07 |
| 8,228,256 | B2 * | 7/2012 | Puente Baliarda .... | H01Q 1/246<br>343/844 |
| 8,896,493 | B2 * | 11/2014 | Baliarda ................ | H01Q 1/246<br>343/700 MS |
| 9,030,367 | B2 * | 5/2015 | Arvidsson ...................... | 343/810 |
| 9,407,011 | B2 * | 8/2016 | Zaghloul ................ | H01Q 19/10 |
| 2009/0224995 | A1 * | 9/2009 | Puente ................... | H01Q 1/246<br>343/850 |

OTHER PUBLICATIONS

Ghaemi, et al., "Surface Plasmons Enhance Optical Transmission Through Subwavelength Holes", In The American Physical Society, Physical Review B, vol. 58, No. 11, Sep. 15, 1998, pp. 6779-6782.

Beruete, et al., "Enhanced Millimeter Wave Transmission Through Quasioptical Subwavelength Perforated Plates", In IEEE Transactions on Antennas and Propagation, vol. 53, No. 6, Jun. 2005, pp. 1897-1903.

Rivas, et al., "Enhanced Transmission of THz Radiation Through Subwavelength Holes", In The American Physical Society, Physical Review B, vol. 68, Nov. 21, 2003, pp. 201306-1-201306-4.

Cao, et al., "Resonantly Enhanced Transmission of Terahertz Radiation Through a Periodic Array of Subwavelength Apertures", In Optics Express, vol. 12, No. 6, Mar. 22, 2004, pp. 1004-1010.

Popov, et al., "Theory of Light Transmission Through Subwavelength Periodic Hole Arrays", In The American Physical Society, Physical Review B, vol. 62, No. 23, Dec. 15, 2000, pp. 16100-16108.

Moreno, et al., "Theory of Extraordinary Optical Transmission Through Subwavelength Hole Arrays", In The American Physical Society, Physical Review Letters, vol. 86, No. 6, Feb. 5, 2001, pp. 1114-1117.

Lezec, et al., "Diffracted Evanescent Wave Model for Enhanced and Suppressed Optical Transmission Through Subwavelength Hole Arrays", In Optical Express, vol. 12, No. 16, Aug. 2, 2004, pp. 3629-3651.

Liu, et al., "Microscopic Theory of the Extraordinary Optical Transmission", In Nature, vol. 452, Apr. 10, 2008, pp. 728-731.

Wood, R.W., "Anomalous Diffraction Graftings", In Physical Review, vol. 48, Dec. 15, 1935, pp. 928-937.

Loui, Hung, "Modal Analysis and Design of Compound Gratings and Frequency Selective Surfaces", Retrieved at <<http://www.ecee.colorado.edu/microwave/docs/theses/thesis_loui_small.pd>>, 2006, 139 pages.

Thio, et al., "Enhanced Light Transmission Through a Single Subwavelength Aperture", In Optics Letters, Optical Society of America, vol. 26, No. 24, Dec. 15, 2001, pp. 1972-1974.

Ishihara, et al., "Terahertz Wave Enhanced Transmission Through a Single Subwavelength Aperture with Periodic Surface Structures", In Japanese Journal of Applied Physics, The Japanese Society of Applied Physics, vol. 44, No. 32, 2005, pp. 1005-1007.

* cited by examiner 630
620
610
640
650
666
655
660
665
670
680
690
$d_x$
$d_b$
$d_c$
$d_d$
$d_e$
$d_f$
$\varepsilon_r = 1$
PEC
$\varepsilon_r = 2$
$\varepsilon_r = 3$
$\varepsilon_r = 12$ 720
730
740
750
760
$d_{cc}$
$d_{dd}$
$d_{ee}$
$d_{ff}$

EXTRAORDINARY ELECTROMAGNETIC TRANSMISSION BY ANTENNA ARRAYS AND FREQUENCY SELECTIVE SURFACES HAVING COMPOUND UNIT CELLS WITH DISSIMILAR ELEMENTS

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

Owing to a physical size and/or material makeup of an antenna or frequency selective surface (FSS) element, a specific range of excitation frequencies (or its operational bandwidth) is required to efficiently drive the antenna. Hence, a first antenna or FSS element having a first dimension and material makeup can be driven by a first set of excitation frequencies and a second antenna or FSS element having a second dimension and material makeup, different from the first, can be efficiently driven by a second set of excitation frequencies. However, it is not efficient for the first set of frequencies to drive the second antenna or FSS element, and similarly it is not efficient for the second set of frequencies to drive the first antenna or FSS element. Inefficient excitation by an electromagnetic source from an attached generator or by free-space radiation results in poor radiated or received power, respectively.

Further, efficient excitation for long wave (low-frequency) transmission requires larger antenna or FSS elements than efficient excitation for short wave (high-frequency) transmission. Hence, the ability of an antenna or FSS array to operate at longer wavelengths can be limited by the size of its antenna or FSS element(s) if they were designed for efficient transmission of short wavelength signals.

SUMMARY

The following is a brief summary of subject matter that is described in greater detail herein. This summary is not intended to be limiting as to the scope of the claims.

A plurality of embodiments are presented herein relating to extraordinary electromagnetic transmission (EEMT) and electromagnetic (EM) wave propagation through periodic structures to enable shifting of various frequencies, e.g., a cutoff frequency, a resonant frequency, a transmission frequency, etc.

In an embodiment, a compound unit cell is presented. The compound unit cell can comprise a plate in which are formed a pair (or a plurality) of apertures, whereby a first aperture has a diameter $d_1$, and a second aperture has a diameter $d_2$, such that $d_1 \neq d_2$. Accordingly, EEMT for this configuration occurs at wavelengths larger than a fundamental period that would be achieved where the first aperture and the second aperture had the same diameter d. In another embodiment, a 2D configuration (e.g., a checkered arrangement) of the compound unit cells comprising a first plurality of apertures having diameters $d_1$, and second plurality of apertures having diameters $d_2$, enables shifting of EEMT wavelengths for both TE (transverse electric) and TM (transverse magnetic) responses. In a further embodiment, the EEMT frequency can be shifted by adding a cover layer (e.g., a dielectric) on one or both sides of the plate comprising the respective apertures.

In another embodiment, a plurality of waveguides are presented in various configurations and/or modifications and respectively display various EEMT effects. The plurality of waveguides can be propagating or evanescent; accordingly, the effects of non-evanescent and evanescent waveguides are presented.

The various embodiments present EEMT for both periodic and single, cut-off apertures in metal plates illuminated by plane wave and excited by propagating waveguides. In a configuration where cylindrical apertures in a periodic array are evanescent or cutoff, greater than unity air-to-aperture interface transmission resonance can be responsible for EEMT. This is possible owing to mutual coupling between the apertures acting external to the aperture openings. This is further corroborated by EEMT observations from arrays of evanescent apertures fed by propagating waveguides. The evanescent apertures act as a narrow band distributed matching network between the connected waveguides and air; a phenomenon not observed for an isolated element.

EEMT resonances maybe lowered further in frequency (making an array even more "extraordinary") by adding dielectric covers and using compounded unit-cells with holes of slightly different diameter. Because slight changes in hole diameters may produce compound periods that can lead to EEMT, manufacturing tolerances can be important, e.g., in the optical regime.

In other embodiments, the various EEMT concepts identified with respect to the apertures and waveguides are applied to a various antenna systems, whereby such antenna systems can comprise of a pair of patch antennas, a plurality of first antenna elements interspersed with a plurality of second antenna elements, etc.

In an embodiment, a pair of patch antennas are presented, whereby the first patch antenna is of a different size (e.g., width, length, area, etc.) to the size of the second patch antenna. In a further embodiment, an array antenna is presented, wherein the array antenna comprises a plurality of first antenna elements being of a first size (e.g., of the size of the first patch antenna) and a plurality of second antenna elements being of a second size (e.g., of the size of the second patch antenna). The first antenna elements and the second antenna elements can have a rectangular (e.g., square) radiating surface. Accordingly, the first antenna elements and second antenna elements can be arranged in a checkerboard arrangement, such that a first antenna element is neighbored on each side by second antenna elements. When the first antenna element is operated in isolation, the first antenna element requires a first range of excitation frequencies. Further, when the second antenna element is operated in isolation, the second antenna element requires a second range of excitation frequencies, wherein, owing to the dissimilar sizes and material makeup of the first antenna element and the second antenna element, the first range of excitation frequencies and the second range of excitation frequencies are different but may overlap. However, when the first antenna element and the second antenna element are operated simultaneously, per operation in the antenna array, a third, common, excitation frequency range can be utilized to simultaneously drive both the first antenna element and the second antenna element. In an embodiment, the third excitation frequency can be lower than the expected frequency range (e.g., first excitation frequency range and second excitation frequency range) of operation of the first antenna element and second antenna element individually.

Operation with the third excitation frequency range can be due to mutual coupling occurring between the first antenna element and a neighboring second antenna element.

In another embodiment, a cover layer (e.g., of dielectric) can be formed over the array comprising the patch antenna(s) and, in a further embodiment, a cover layer can be formed over the plurality of first and second antenna elements comprising the array antenna. The respective cover layers enable a further shift of transmissible frequencies from the patch antenna or the array antenna, e.g., operation with a fourth frequency range commonly applied to the first and second antenna elements.

Per the various embodiments presented herein, one or more dissimilarities (e.g., size, materials, placement, etc.) between two or more array elements (e.g., apertures, antenna patches, ground plane, substrate, cover layer(s), etc.) can be utilized to enable operation of an array such that while a first array element is energized by a first frequency when energized in isolation, and a second array element is energized by a second frequency when energized in isolation, a mutual coupling arising from the one or more dissimilarities can enable the array to be energized with a third, common frequency.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
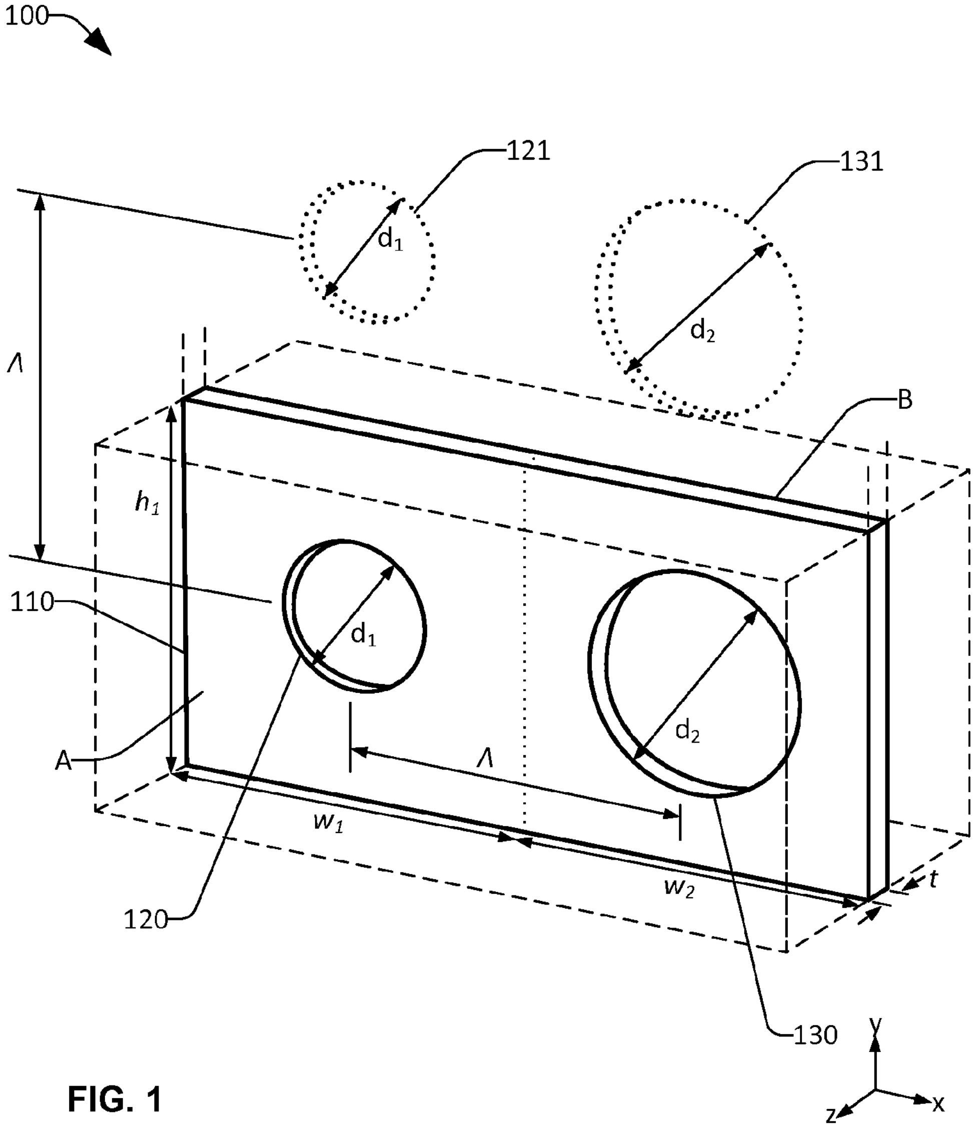
FIG. 1 illustrates an exemplary configuration for a compound unit cell to obtain EEMT at wavelengths larger than that of a fundamental period.

Various technologies pertaining to obtaining extraordinary electromagnetic transmission (EEMT) at wavelengths different to those conventionally obtained for a fundamental period are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

Before the various embodiments are discussed in detail, the following discussion is presented with regard to EEMT and how it can be utilized to enable a frequency selective surface or an antenna array to be driven with an excitation frequency different to that which, practically and/or theoretically, is a resonant frequency for the frequency selective surface element or the antenna element. In an embodiment, as further described, a first array element having a first size (e.g., diameter, length, etc.) can be co-located with a second array element having a second size. Theoretically, the first array element has a first resonant frequency and the second array element has a second resonant frequency. However, owing to a mutual coupling effect(s) established between the first array element and the second array element, the first array element and the second array element can be simultaneously driven with a third frequency, wherein the third frequency is different to the first resonant frequency and the second resonant frequency. The term "array element" denotes, and can be equally applied herein to, an antenna element(s) and also an aperture(s).

EEMT refers to the phenomenon of enhanced long-wave propagation through sub-wavelength aperture(s) (e.g., perforation(s), hole(s), slit(s), opening(s)) in single/multi-layer film or plate (e.g., a metallic plate). The phenomenon has been identified in a plurality of regimes of the electromagnetic spectrum, e.g., optical (300 nm-1800 nm), terahertz, and microwave (45 GHz-110 GHz), etc. The extraordinary aspect of EEMT relates to the cutoff behavior associated with electromagnetic wave propagation through the aperture(s) of the plate, which can act as single-conductor metallic waveguide(s). For air-filled cylindrical waveguides, the phase velocity of the fundamental TE11 propagation mode approaches zero when its aperture diameter is smaller than 58.6% of the wavelength of excitation. Below this point, significant wave attenuation can occur. Neglecting conductor losses, the attenuation per wavelength of propagation distance as a function of waveguide diameter is given by:

$$e^{-j\beta\lambda_0} = e^{-j\left(-\sqrt{(2\pi)^2 - \left(\frac{1.841\times 2}{d/\lambda_0}\right)^2}\right)} \qquad \text{Eqn. 1}$$

where 1.841 is the first root of the cylindrical Bessel function $J_1'=0$, $\beta$ is the propagation constant, d is the diameter of the waveguide aperture, and $\lambda_0$ is the free-space excitation wavelength.

Two observations can be made regarding plane wave scattering from a periodic array comprising sub-wavelength apertures. A first observation, commonly known as Wood's Anomaly, indicates that for an array comprising a plurality of apertures each having the same diameter d, a transmission null can occur when a wavelength of excitation $\lambda_0$ is an integer multiple of the array period $\Lambda$ of the apertures at normal incidence. For example, if the free-space period is $\lambda_0=5$ mm, then a transmission null occurs at $C_0/\lambda_0 \sim 60$ GHz, where $C_0$=speed of light. Further, if the surfaces of the array are covered by a dielectric of relative permittivity $\in_r$, then the transmission null can be shifted towards $\lambda_0\sqrt{\in_r}$ in wavelength or $C_0/\lambda_0\sqrt{\in_r}$) in frequency.

Wood's Anomaly can be explained using Fourier decomposition which approximates an arbitrary wave front using the superposition of plane waves. If one such arbitrary wave front is a diffracted wave at an interface between air and a periodic structure, then the diffracted wave can be represented by a superposition of plane waves. A one-to-one correspondence between a spatial harmonic function (in this case, the periodic array structure) and the plane wave can exist. In order to maintain phase continuity when a plane wave is incident at an angle $\theta$ with respect to the plane normal, the projection of the tilted phase front on the plane has a periodicity $\Lambda=\lambda/\sin(\theta)$. If $\Lambda=\lambda$ then the angle of incidence $\theta=90°$ which corresponds to a grazing plane wave. Conversely, if the plane containing the spatial harmonic function with period $\Lambda$ is located at $\zeta=0$, then a grazing plane wave is favored, or a wave with a dominant $\hat{\zeta}$ component to maintain phase continuity. Hence, if most of the incident energy is scattered at grazing angles when $\Lambda=\lambda$, then little energy will be transmitted. Furthermore, if the scatter only supports propagating modes with $E_\zeta=0$ or $H_\zeta=0$, then these components of the scattered wave can be significantly attenuated.

The second observation pertains to a transmission peak which can occur at a wavelength greater than the free-space period $\lambda_0$ or at a frequency lower than the frequencies of the aforementioned transmission null(s) regardless of whether the apertures support propagating modes or not. If the aperture is evanescent, then the transmission peak attenuates with increasing plate thickness but shifts higher in frequency. Conversely, if the aperture is propagating, then the transmission peak does not attenuate but shifts to a lower frequency with increasing plate thickness.

The second observation is collectively known as EEMT. Since $|\sin(\theta)|\leq 1$ for real angles, $\Lambda$>?/sin($\theta$) is allowed. However, for $\Lambda<\lambda$ where EEMT occurs, $\theta$ would have to be imaginary. A plane wave with an imaginary angle of incidence represents an evanescent wave. In treating plane wave scattering from periodic problems at normal incidence, the incident and reflected waves above a square periodic unit cell may be represented by a Fourier series or Floquet modes with propagation constants:

$$\beta_{mn} = \sqrt{\left(\frac{2\pi}{\lambda}\right)^2 - (m^2+n^2)\left(\frac{2\pi}{\Lambda}\right)^2} \qquad \text{Eqn. 2}$$

When $\lambda=\Lambda$, Eqn. 2 shows that all but $\beta_{00}=2\pi/\lambda$, $\beta_{10}=0$, and $\beta_{01}=0$ are evanescent, and only $\beta_{00}>0$ is propagating. When $\lambda>\Lambda$, even $\beta_{10}$ and $\beta_{01}$ are evanescent. Finally, more propagating modes appear in the expansion when $\lambda<\Lambda$. Regardless of the state of evanescence, these modes are collectively referred to as diffracted orders and their amplitudes are determined by enforcing field continuity at the interface; a process known as mode matching. Analysis of plane wave scattering from periodic hole arrays can applied to both evanescent or propagating apertures. The forward transmission coefficient for either case is given per Eqn. 3:

$$S_{21}^{ac}=S_{21}^{bc}[1-\Delta_F]^{-1}S_{21}^{b}S_{21}^{ab} \qquad \text{Eqn. 3}$$

where $$\Delta_F=S_{21}^{b}S_{22}^{ab}S_{12}^{b}S_{11}^{bc}. \qquad \text{Eqn. 4}$$

Eqn. 3 and Eqn. 4 are generalized scattering matrix expressions. If M, N, and P represent the number of modes used to expand the fields in air, aperture, and air/waveguide, respectively; then the sizes of $S_{21}^{ac}$, $S_{21}^{bc}$, $S_{21}^{b}$, $S_{22}^{ac}$, $S_{12}^{b}$, $S_{11}^{bc}$, $S_{21}^{b}$, and $S_{21}^{ab}$ are P×M, P×N, N×N, N×N, N×N, N×N, N×N and N×M, respectively. The superscripts describe the various scattering regions with a, b, and c representing air, aperture, and air respectively. Superscript combinations represent interfaces and subscripts have their usual S parameter meanings. For example, $S_{21}^{ab}$ represents the forward scattering coefficients at the interface between air and the front aperture.

The resonant nature presented in Eqn. 3 is apparent when treated as a scalar equation where M=N=P=1. Forward transmission nulls occur if any of the parameters in the numerator becomes zero, i.e., if the transmission across any interface or through the hole is zero, then the transmission through the entire structure would be zero. If $|\Delta F|$ is large, then the magnitude of the denominator will be small which can lead to resonances. Unity zero-order transmission occurs if the magnitude of the numerator is equal to the magnitude of the denominator. Because grating lobes or higher order propagating modes pop into real space when $\lambda<\Lambda$ which take away power from the normal propagating mode, unity normal incident plane wave transmission is possible only for $\lambda>\Lambda$. Transmission resonances can occur at locations where $\Delta_F$ is real with Q of the resonances proportional to $|\Delta F|$ for the fundamental propagating mode in 1D gratings. In a situation where the fundamental mode is evanescent such as a cylindrical aperture in cutoff, $|\Delta F|$ is small due to $S_{21}^{b}=S_{12}^{b}=e^{-\alpha t}$, where t is the thickness of the hole, and $\alpha$ the attenuation constant. This results in the denominator being near unity. In order for EEMT to occur, the numerator must also be near unity. But since the numerator is multiplied by $S_{21}^{b}=e^{-\alpha t}$, it is not near unity. Essentially, a situation arises where something small is divided by one minus something smaller. This can place the interface transmission coefficients $S_{21}^{ab}=S_{21}^{bc}$ in the numerator under suspicion of resonant behavior.

To identify how interface transmission coefficients may affect EEMT, zeroth-order $S_{21}^{ac}$ ($\text{Floquet}_{00}$ to $\text{Floquet}_{00}$) air-hole-air transmission, and $S_{21}^{ab}$ ($\text{Floquet}_{00}$ to $TE_{11}$) air-hole interface transmission are determined using a mode-matching technique for the case of a square array of air-filled cylindrical apertures with diameters d={1, 2, 3, 4} mm, thickness of 0.5 mm, and a period, $\Lambda$=5 mm. As the aperture diameter decreases from 4 mm (propagating) to 2 mm (evanescent), air-to-waveguide interface transmittances can become more and more resonant with magnitudes exceeding unity. Accordingly, the resonances shift higher in frequency with decreasing aperture diameter. Correspondingly, an air-hole-air EEMT can depict similar behavior. It is to be noted that the resonance frequency locations of the interface transmittance do not correlate to the resonant locations in frequency of the total transmittance. Hence, the evanescent waveguide section behaves like a resistive and reactive load attached to each of the interfaces, lowering its Q and resonance frequency, respectively. In contrast, zero-order transmission resonance of propagating apertures shift lower in frequency with increasing hole thickness. These resonance locations are altered by the lumped reactive air to aperture interfaces. Finally, at an aperture diameter of 1 mm, the interface resonance can succumb to the extreme cut-off of the aperture.

Per the foregoing, in a case where cylindrical apertures in a periodic array are evanescent or cutoff, greater than unity air-to-aperture interface transmission resonance can be responsible for EEMT. This is possible due to mutual coupling between the apertures external to the hole; e.g., greater than unity air to single aperture coupling is not possible unless surface corrugations are used, effectively enlarging the wave collection area.

As previously mentioned, EEMT can occur when EM waves, having a particular wavelength, propagate through sub-wavelength apertures in a periodically perforated plate or film (e.g., a metallic plate). EEMT relates to cutoff behavior of the EM waves passing through the apertures, whereby the cutoff behavior can occur at a particular frequency (e.g., a first frequency), whereby the particular frequency can be a function of aperture size, and/or the aperture periodicity. The various embodiments presented herein enable shifting of the cutoff behavior from the first frequency to a second frequency.

FIG. 1 illustrates a compound unit cell 100 configured to enable obtaining EEMT at wavelengths larger than that of a fundamental period $\Lambda$. In accordance with Wood's anomaly, EEMT can consistently occur below a cutoff frequency where an array period $\Lambda$ is equal to an excitation wavelength $\lambda$. Therefore, it is possible to obtain EEMT at even longer wavelengths by changing an array period from $\Lambda$ to $2\Lambda$. This is accomplished by periodically replicating the compound unit cell 100 with a new period of $2\Lambda$ in the x and/or y directions as shown in FIG. 1. However, such a configuration 100, as presented in FIG. 1, does not eliminate the possibility of obtaining EEMT near $\Lambda$. The compounded unit-cell can comprise a plate 110 (or membrane, film, etc.), having a thickness t, in which have been formed two holes 120 and 130, which can be formed by any suitable process, such as etching, drilling, ion milling, etc. The holes 120 and 130 have different diameters, whereby the hole 120 has a diameter of $d_1$, and hole 130 has a diameter of $d_2$. Each of the holes 120 and 130 can be considered to have been formed in respective individual cells of plate 110, with the hole 120 being formed at the center of a cell $w_1 \times h_1$, and hole 130 being formed at the center of a cell having dimensions $w_2 \times h_1$. The arrangement shown in FIG. 1 is referred to herein as a 1D configuration, whereby the 1D configuration has an array periodicity $\Lambda$ between holes 120 and 130, in the horizontal (x) direction. Plate 110 can be formed from any material which can reflect, transmit, or absorb an incoming wave in the frequency range of excitation, such as gold, silver, nickel, copper, aluminum, a nickel-cobalt ferrous (KOVAR) alloy, steel, etc., or a layered structure comprising one or more materials such as a primary plate and a thin coating.

Figure 2:
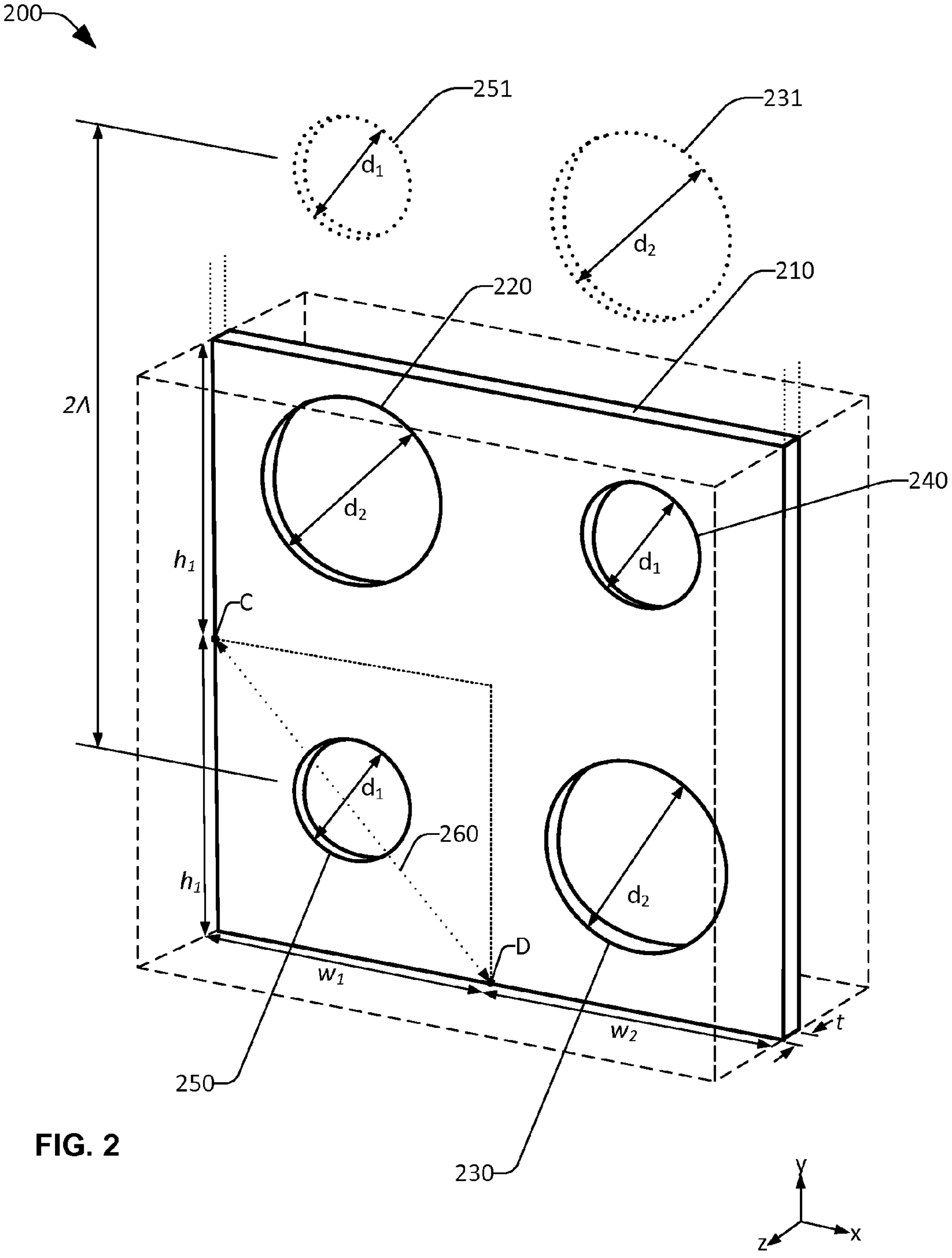
FIG. 2 illustrates an exemplary configuration for a 2D compound unit cell to obtain EEMT at wavelengths larger than that of a fundamental period.

In another embodiment, as shown FIG. 2, the 1D arrangement of the compound unit cell 100 can be combined with another compound unit cell to form the 2D configuration 200. Configuration 200 comprises a plate 210, which further comprises four holes 220-250, such that the periodicity $\Lambda$ extends in the horizontal (x) and vertical (y) directions, holes 231 and 251 are shown in the vertical direction. As shown, holes 220 and 230 can have the same hole size $d_2$, while holes 240 and 250 can have the same hole size $d_1$, where $d_1 \neq d_2$.

Figure 3:
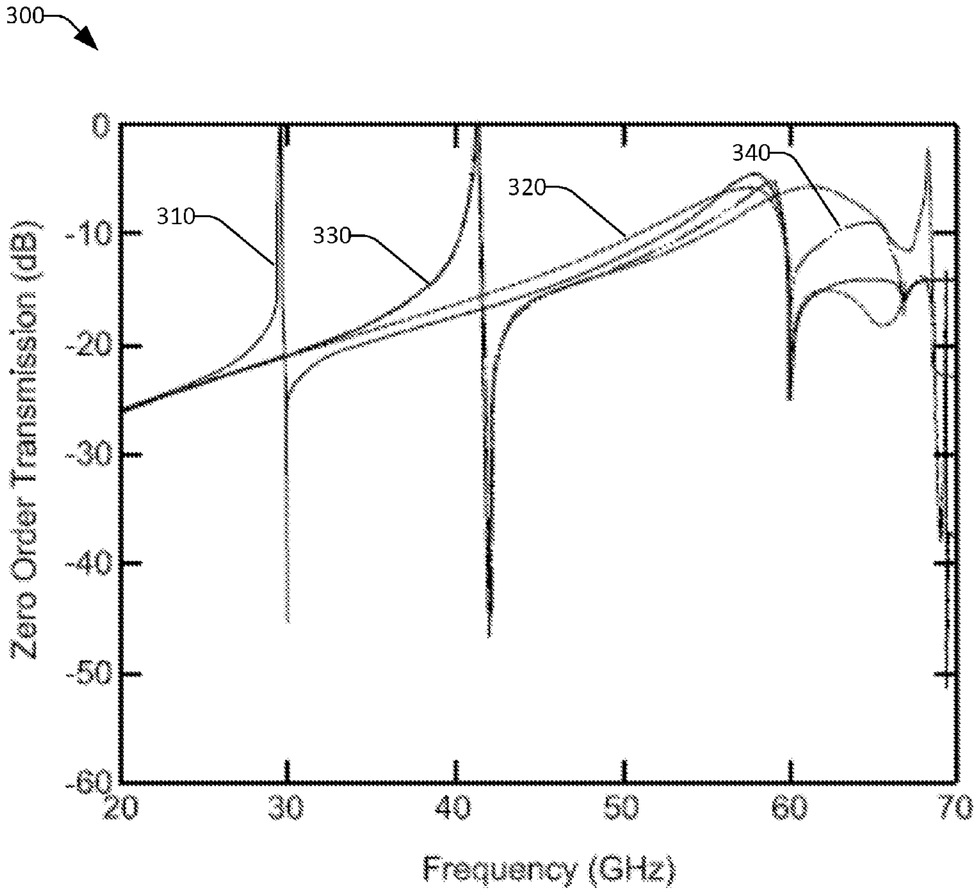
FIG. 3 presents plots of EEMT response results for a compound unit cell and a 2D compound unit cell.

Turning to FIG. 3, a chart 300 of zero-order transmission (dB) versus frequency (GHz) is presented for various TE and TM results obtained for configurations 100 and 200. The respective results shown in plots 310-340 were conducted with configurations 100 and 200 having the following dimensions: $d_1$=2 mm, $d_2$=3 mm, $h_1$=5 mm, $h_2$=5 mm, t=0.5 mm, $w_1$=5 mm, and $w_2$=5 mm.

As shown by plot 310, the 1D compound periodic case under TE-polarized plane-wave excitation, an EEMT peak only occurs near 60 GHz (e.g., a function of Λ=5 mm) as well as an EEMT peak occurring at about 30 GHz (e.g., a function of Λ=10 mm). However, with plot 320, the 1D compound periodic case under TM-polarized plane-wave excitation, only an EEMT peak occurs at near 60 GHz, while there is no peak at about 30 GHz as the periodicity in ŷ is still Λ=5 mm, and hence the EEMT peak is a result of the Λ=5 mm periodicity. As previously mentioned, per Wood's anomaly, for an example free-space period is $\lambda_0$=5 mm, then a transmission null occurs at $C_0/\lambda_0$~60 GHz. Hence, one or more of the various embodiments presented herein enable shifting and/or generation of a transmission null at a frequency which is different to that anticipated by Wood's anomaly.

Results for configuration 200 are presented in plots 330 (2D compound periodic TE) and 340 (2D compound periodic TM), whereby the periodicity Λ=10 mm extends in both the TE and TM directions. For both plots 330 and 340, an EEMT peak for both TE and TM occurs at about 42 GHz, a frequency that corresponds to $\Lambda=\Lambda=\sqrt{5^2+5^2}=7.07$ mm, or the length of the diagonal 260 between points C and D in FIG. 2. For the 2D TM plot 340, an EEMT peak occurs at about 60 GHz. However, for the 2D TE plot 330, the EEMT peak occurs at a higher frequency of about 68 GHz, and is broadened in bandwidth, in comparison with the plots 310 and 320 for configuration 100.

As previously mentioned, for a periodic array comprising holes having the same diameter (e.g., d=5 mm) a transmission null can occur at 60 GHz. However, by fabricating an array comprising a periodic dispersion of holes, whereby adjacent holes are of differing diameters $d_1$ and $d_2$ (e.g., configurations 100 and 200), a transmission peak can still occur at about 60 GHz (e.g., where $d_1=d_2$=5 mm and also the Λ=5 mm), but an EEMT peak can also occur at about 30 GHz (e.g., configuration 100, TE plot 310). Further, when extended in 2D, a first EEMT peak can occur at 42 GHz (e.g., configuration 200, TE plot 330), and a second EEMT peak can occur at 68 GHz (e.g., configuration 200, TE plot 330).

It is to be appreciated that while FIGS. 1 and 2 illustrate plates having holes with diameters $d_1$ and $d_2$, any number of holes with differing diameters can be utilized for the various embodiments presented herein. For example, a configuration can fabricated comprising a periodicity of first holes having a first diameter, a periodicity of second holes having a second diameter, and a periodicity of third holes having a third diameter, with an arrangement $d_1$, $d_2$, $d_3$, $d_1$, $d_2$, $d_3$, etc., extending in both the x and y directions, forming a checkerboard arrangement (e.g., 2D). In another embodiment, an arrangement $d_1$, $d_2$, $d_3$, $d_1$, $d_2$, $d_3$ in the x direction can be columnar in they direction, such that each column in they direction comprises apertures having the same size (e.g., the 1D arrangement of FIG. 1 including holes 121 and 131). In a further embodiment, the apertures can be arranged in a non-regular pattern, $d_1$, $d_3$, $d_4$, $d_1$, $d_2$, $d_1$, $d_3$, $d_3$, $d_1$, $d_4$, $d_2$, $d_1$, etc., in the x and y directions.

Figure 4:
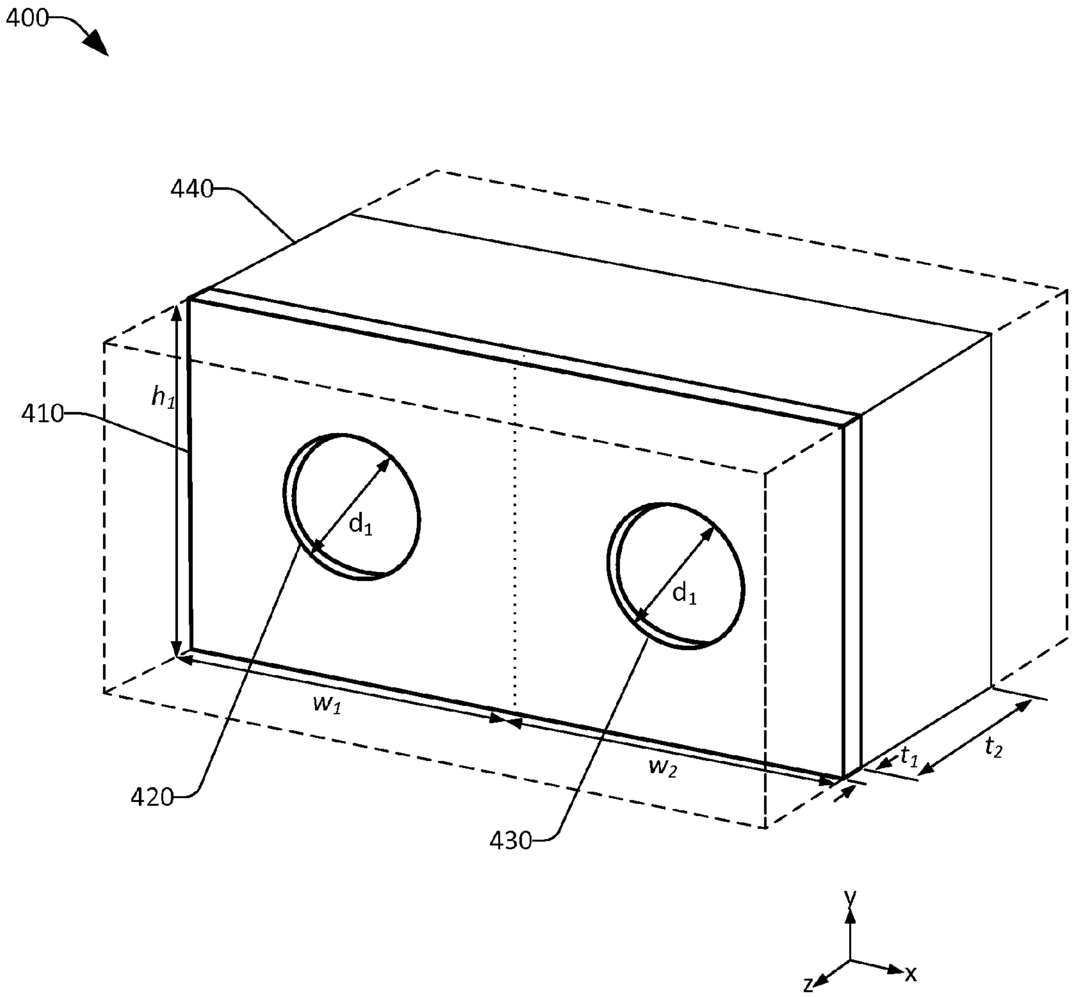
FIG. 4 illustrates an exemplary configuration for a compound unit cell comprising a cover layer to obtain EEMT at wavelengths larger than that of a fundamental period.

FIG. 4 illustrates configuration 400, whereby a cover layer 440 has been added to one side of a plate 410, with the plate 410 containing two periodic holes 420 and 430, whereby the holes 420 and 430 have the same diameter, $d_1$. Configuration 400 has comparable components to those previously described in FIG. 1. In an embodiment, the layer 410 can be a dielectric material, whereby any suitable material can be utilized such as quartz, ROGERS RT/DUROID microwave substrate, glass, Teflon, plastic, ceramic, a semiconductor, etc. Addition of the layer 410 can enable an increase in aperture-to-aperture mutual coupling between the hole 420 and the hole 430. In an embodiment, while not shown, a cover layer 440 can be applied to both sides of the plate 410.

While not shown in FIGS. 1, 2, and 4 the respective apertures 120, 130, 220, 230, 240, 250, 420, and 430 can be filled with different dielectric materials to enable a mutual coupling to be generated between the respective apertures that would be different to the mutual coupling obtained if the respective apertures were filled with the same dielectric material.

Figure 5:
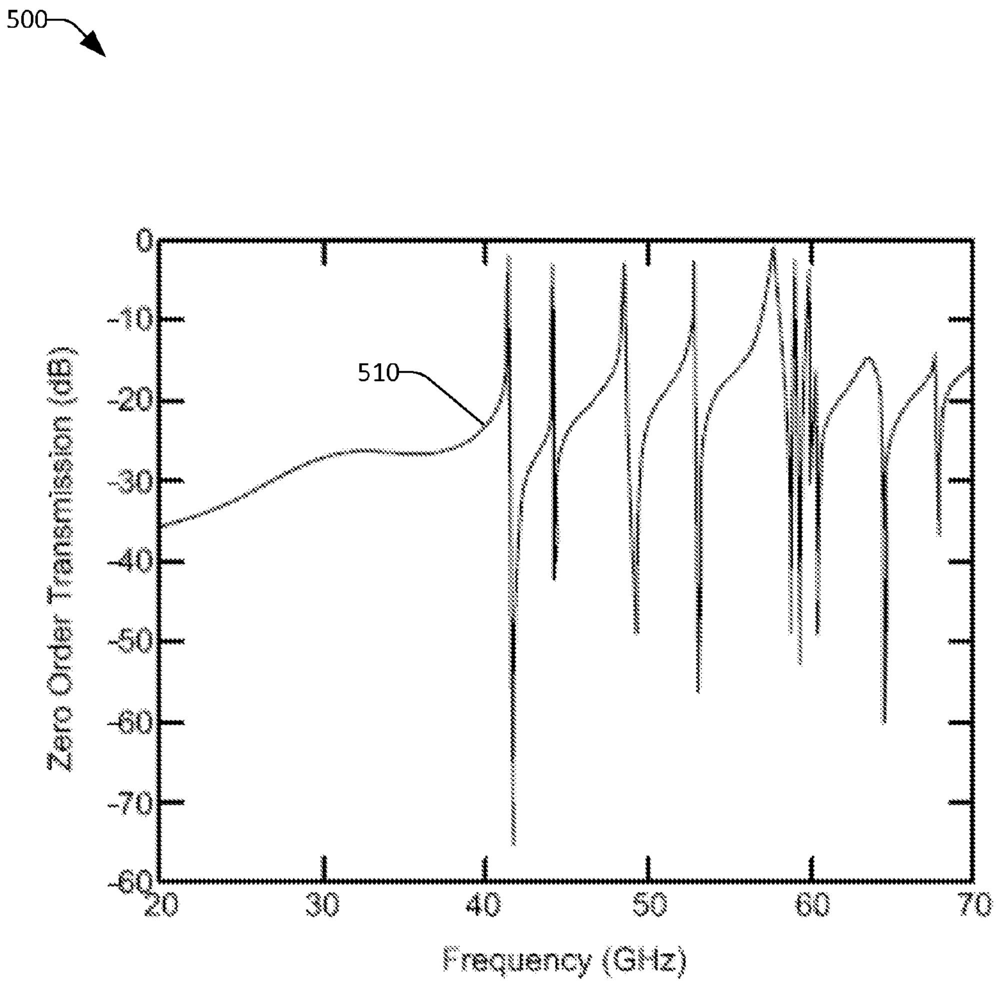
FIG. 5 presents a plot of EEMT response results for a compound unit cell comprising a cover layer.
Figures 6A, 6B, 6C, 6D, 6E, 6F, 7A, 7B, 7C, 7D, 7E, 7F:
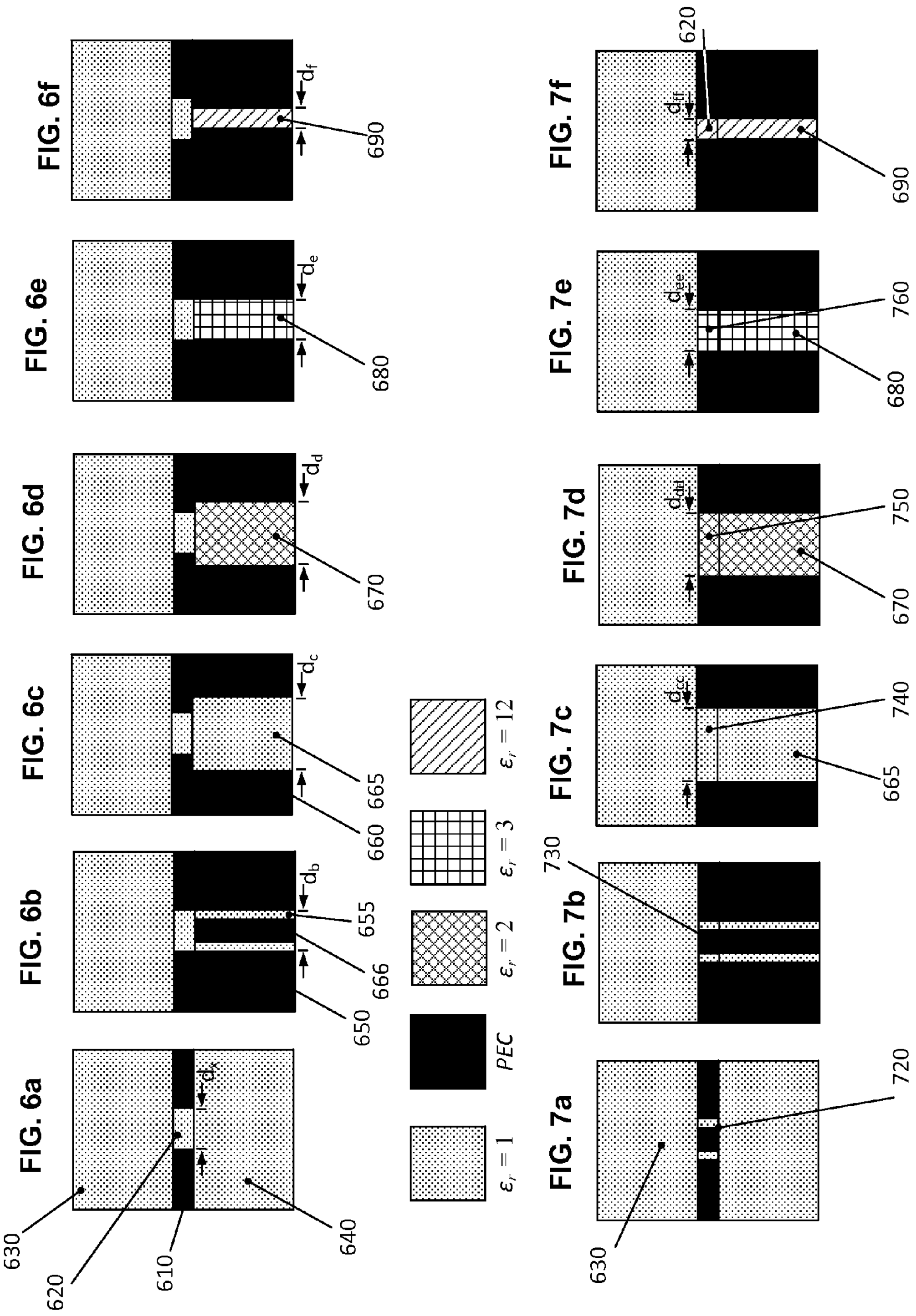
FIGS. 6*a*-6*f* illustrate longitudinal cross section views of cylindrical radiators comprising evanescent apertures.
FIGS. 7*a*-7*f* illustrate longitudinal cross section views of cylindrical radiators comprising propagating apertures.

Turning to FIG. 5, a chart 500 including a plot 510 of zero-order transmission (dB) versus frequency (GHz) is presented for configuration 400. The measurements were conducted with configuration 400 having the following dimensions: $d_1$=2 mm, $h_1$=5 mm, $t_1$=0.5 mm, $t_2$=5 mm, $w_1$=5 mm, and $w_2$=5 mm. Layer 440 is formed from quartz having a dielectric constant, or relative permittivity ($\in_r$)=2.16. As shown with plot 510, a plurality of EEMT peaks occur, extending down to about 40 GHz, which corresponds to a $\lambda=\Lambda\sqrt{2.16}$.

While not shown in the configurations 100, 200 and 400, it is to be appreciated that the respective configurations can also be fabricated with concentric-corrugated bulls-eye structures. For example, plate 110 can be formed with one or more concentric corrugations centered at each aperture 120 and 130 so as to form respective bulls-eye patterning around each aperture 120 and/or 130. Further, the concentric-corrugated bulls-eye patterning can be formed one either side of plate 110, e.g., on side A and/or side B. The concentric corrugated bulls-eye patterning can also be applied to plates 210 and 410.

Hence, per the foregoing, with configurations 100 and 200, a pair of apertures can have a resonant frequency (e.g., a third resonant frequency) that, under normal conditions, neither a first aperture having a diameter $d_1$, and a second aperture having a diameter $d_2$, could operate with the third resonant frequency. Under normal conditions the first aperture would only operate at a first resonant frequency and the second aperture would only operate at a second resonant frequency, whereby the first resonant frequency, the second resonant frequency and the third resonant frequency are all different. However, owing to mutual coupling effects between the first aperture and the second aperture, the first aperture and the second aperture can both be excited by the third, common, frequency. While the foregoing configurations 100, 200, and 400 relate to plane wave scattering from metallic plate perforated with sub-wavelength hole arrays to enable EEMT to be achieved, the concept maybe extended to antenna arrays whereby a volume on one side (e.g., side A or side B of configuration 100) is replaced with a transmission line(s). In a situation where an array of evanescent scatters enables efficient EM transmission to occur, accordingly, an array of evanescent or inefficient radiators connected to transmission lines can do the same.

A conventional approach to implementing an antenna array is to impedance match each of the radiating elements input impedance to free-space in accordance with a desired bandwidth. When the radiating elements are brought together, mutual coupling can alter the input match because each antenna is loaded by its neighbor, accordingly, the feed network must be re-tuned to compensate. Due to the magnitude of the problem with respect to the wavelength of excitation, optimization is typically performed numerically at a 2 by 2 sub-array level followed by post production tuning at the input port of the entire antenna array. In effect, the square array is being viewed as being formed from N×M high-frequency radiators spaced T apart.

However, rather than the array being a N×M square array, the arraying process can also be viewed as a square array formed from N/p×M/p (where p≥2) subarrays of $p^2$ high-frequency radiators that are coupled to each other. If the $p^2$ coupled-radiators are viewed as a single radiating element with an effective aperture area $\Lambda=p^2T^2$, then the single radiating element should be capable of collecting EM waves with wavelengths on the order of pT. The efficiency with which the $p^2$ coupled-radiators collect the EM waves can be dependent upon any of the degree of mutual coupling, radiator configuration, feed network configuration, impedance matching at the sub-array's input port, etc.

This N/p×M/p array approach differs from the classical approach in that the quad coupled-radiators can be tuned collectively to radiate at a frequency range corresponding to the enlarged period rather than the impedance-matched frequency range of the individual radiators. In effect, a new radiating element is created, a similar methodology can be applied with multi-band antennas. When a smaller patch antenna is co-located with a larger patch antenna such that its shorter edge radiates shorter wavelengths while the longer edge radiates longer wavelengths, the two antennas can be considered to be sub-arrayed. If the longer edge were to be segmented into shorter edges; while each short edge is evanescent, mutual coupling may enable the shorter edges to behave as a longer edge. By connecting coherent sources to each of the short edge segments, a current distribution at long wavelengths may be created across the face of the array enabling long wave radiation. Application of EEMT enables a novel approach to evaluating a behavior of a classical array(s). Instead of connecting efficient radiators to every period of an array, inefficient radiators may be coupled across multiple periods of an array to allow radiation of longer wavelengths. Such an approach may be utilized to produce arbitrary current distribution for the purpose of controlling radiation. Accordingly, one or more EEMT approaches can be utilized to compensate for and/or adjust for return losses and/or insertion losses that can occur at a point (e.g., a transmission line connection to another component) in a circuit, such as in an array antenna system.

To apply the concept of EEMT to an antenna array, an evanescent air-filled aperture radiator can be fed by different types of propagating waveguides, as shown by the various configurations presented in FIGS. 6*a*-6*f*. Referring to the respective configurations, 6*a*-6*f*, a plate 610 having a thickness of 0.5 mm, has an aperture 620 formed therein, wherein the aperture 620 has a diameter $d_x$=2 mm. For configurations 6*b*-6*f* one side of the aperture 620 of configuration 6*a*, region 630, remains air filled, while the other side of the aperture 620 of configuration 6*a*, region 640, is fed by different types of propagating waveguides. In the following, return loss measurements were undertaken at an input port of the propagating waveguide and examined for the case of a single element situated in an infinite ground plane versus that of the same element embedded in an infinite array with period of 5.0 mm. In an aspect, the return loss measurements can be conducted with CST microwave studio. As shown, respective regions of the configurations 6*a*-6*f* have different $\in_r$'s. The air filled regions (e.g., regions 620, 630, 640, 665) have an $\in_r$=1, the plate 610 and other structures (e.g., structures 650, 660, 666, as indicated by solid black) have a $\in_r$ of a perfect electric conductor (PEC), waveguide 670 of configuration 6*d* has an $\in_r$=2, waveguide 680 of configuration 6*e* has an $\in_r$=3, and waveguide 690 of configuration 6*f* has a $\in_r$=12. Further, while the diameter $d_x$ of the aperture 620 is maintained at 2 mm for configurations 6*a*-6*f*, the diameters of the respective waveguides is not constant. For example, configuration 6*b* has a waveguide diameter $d_b$ of 2 mm, configuration 6*c* has a waveguide diameter $d_c$ of 3.5 mm, configuration 6*d* has a waveguide diameter $d_d$ of 2.5 mm, configuration 6*e* has a waveguide diameter $d_e$ of 2.0 mm, and configuration 6*f* has a waveguide diameter $d_f$ of 2.0 mm.

As shown in the configurations presented in FIGS. 7*a*-7*f*, the respective apertures of the configurations presented in FIGS. 6*a*-6*f* have been modified to be non-evanescent. For example, configuration 7*a* has a waveguide diameter of 2 mm, for configuration 7*b* the waveguide has been extended into the aperture opening diameter of 2 mm, configuration 7*c* the aperture has been enlarged to a diameter $d_{cc}$ of 3.5 mm (e.g., the same as waveguide 665), configuration 7*d* the aperture 750 has been enlarged to a diameter $d_{dd}$ of 2.5 mm, configuration 7*e* the waveguide 680 having a diameter of $d_{ee}$ 2.0 mm has been extended into the aperture 760, and for configuration 7*f* the aperture has been reduced to a diameter $d_{ff}$ of 1.0 mm, with the material of waveguide 690 extending into the aperture. Based thereon, the respective measurements undertaken for configurations 6*a*-6*f* were repeated. The two cases (e.g., propagating versus none evanescent) are compared in the respective plots presented in FIGS. 8-13, illustrating the effect(s) of evanescent apertures and non-evanescent apertures on array performance.

Figure 8:
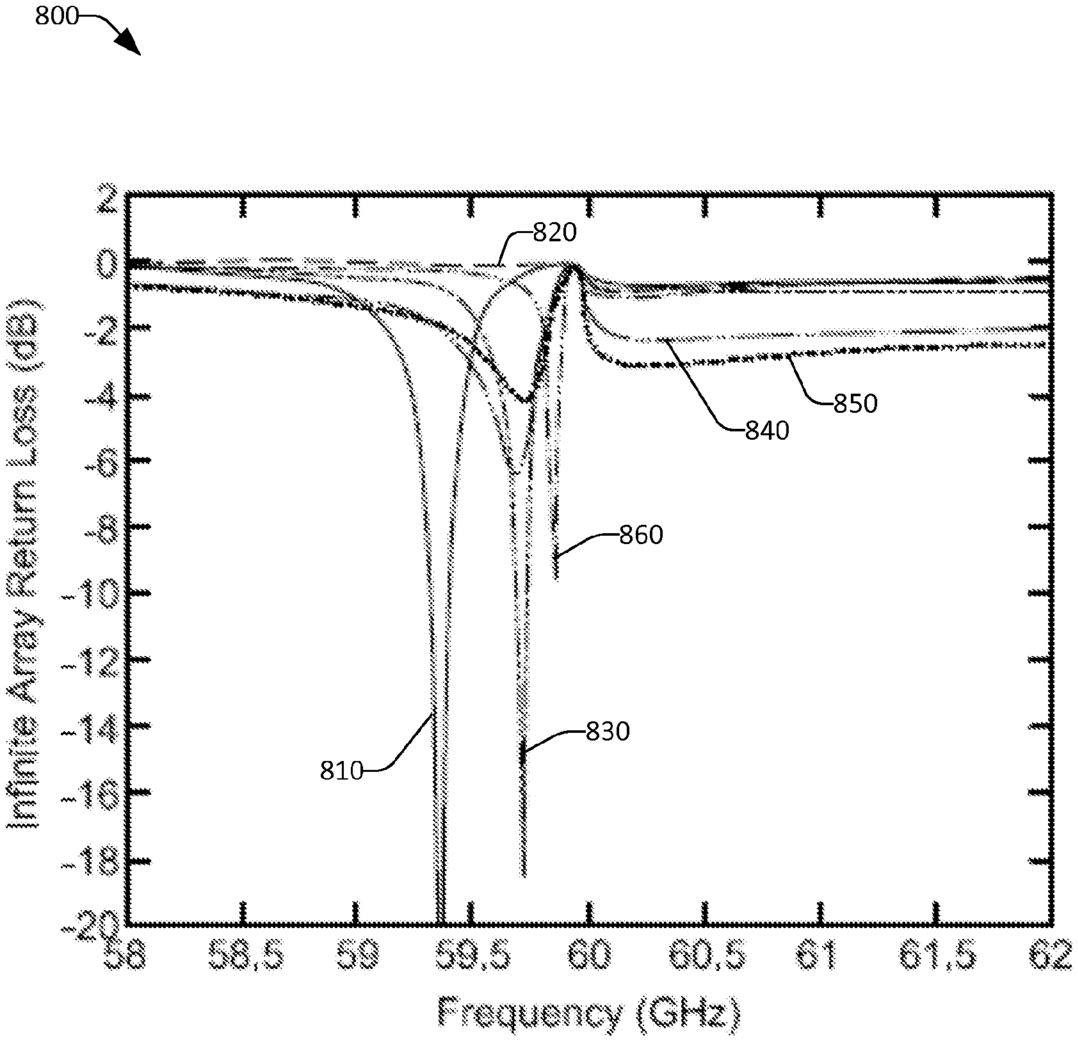
FIG. 8 presents plots of infinite array return loss for the evanescent apertures presented in FIGS. 6*a-f*.
Figure 9:
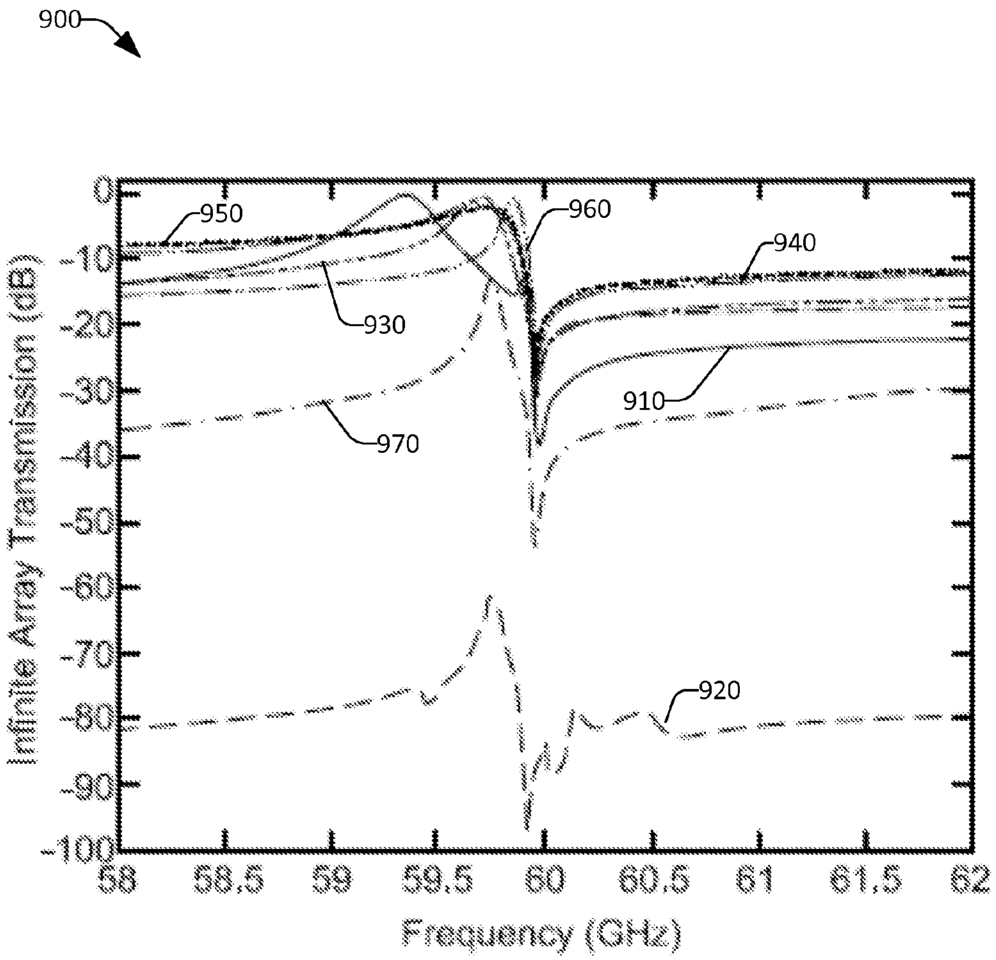
FIG. 9 presents plots of infinite array transmission for the evanescent apertures presented in FIGS. 6*a-f* and TE11 cylindrical mode to TE11 coaxial mode coupling.

FIGS. 8 and 9 present charts 800 and 900 depicting respective response results for cut-off cylindrical apertures in an infinite array for the propagating waveguide presented in FIGS. 6*a*-6*f*. FIG. 8 presents plots for infinite array return loss (dB) versus frequency (GHz) for various configurations presented in FIGS. 6*a*-6*f*, and FIG. 9 presents plots for infinite array transmission (dB) versus frequency for the various configurations presented in FIGS. 6*a*-6*f*. Plots 810 and 910 are for configuration 6*a*, air filled aperture, and air filled regions on both sides, where the $\in_r$=1. Plots 820 and 920 are for configuration 6*b*, air filled aperture connected to a coaxial waveguide, where the $\in_r$=1. Plots 830 and 930 are for configuration 6*c*, air filled aperture connected to a waveguide, where the $\in_r$=1. Plots 840 and 940 are for configuration 6*d*, air filled aperture connected to a waveguide, where the $\in_r$=2. Plots 850 and 950 are for configuration 6*e*, air filled aperture connected to a waveguide, where the $\in_r$=3. Plots 860 and 960 are for configuration 6*f*, air filled aperture connected to a waveguide, where the $\in_r$=12.

Figure 10:
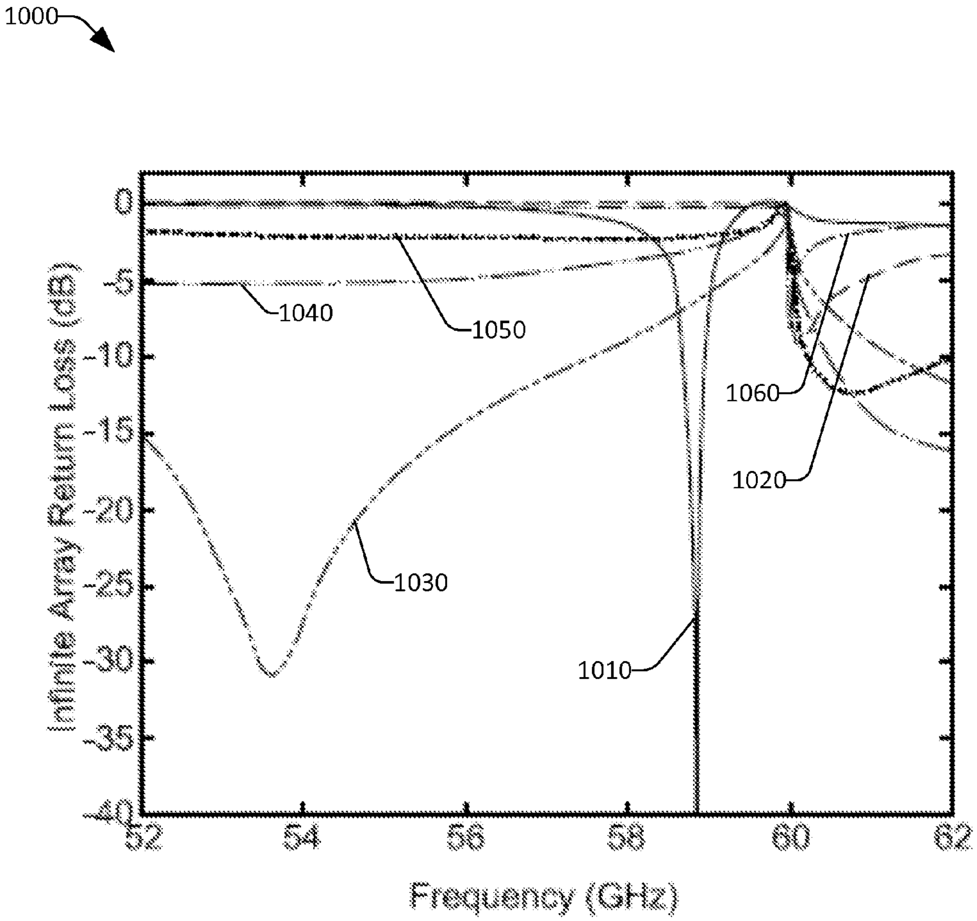
FIG. 10 presents plots of infinite array return loss for the propagating apertures presented in FIGS. 7*a-f*.
Figure 11:
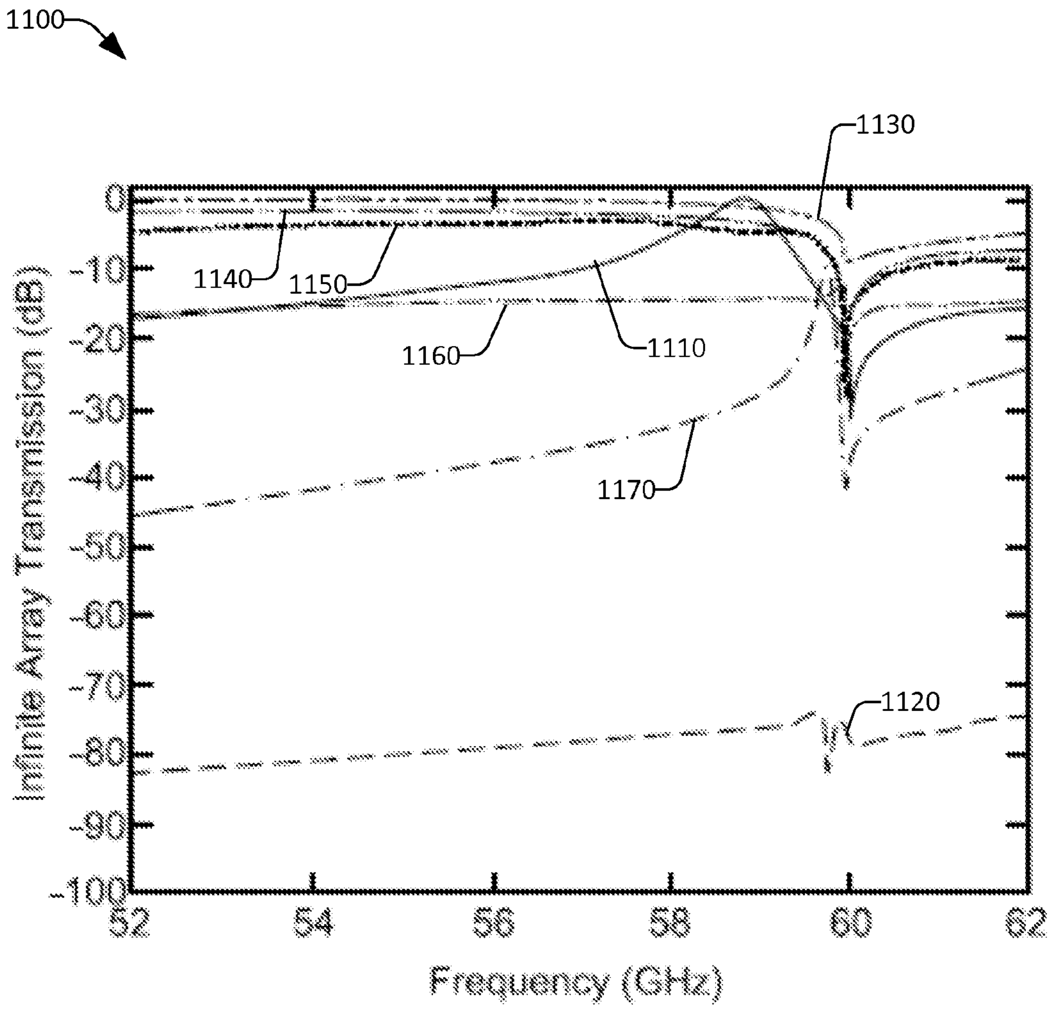
FIG. 11 presents plots of infinite array transmission for the propagating apertures presented in FIGS. 7*a-f* and TE11 cylindrical mode to TE11 coaxial mode coupling.

FIGS. 10 and 11 present charts 1000 and 1100 depicting respective response results for propagating cylindrical apertures in an infinite array for the propagating waveguide presented in FIGS. 7*a*-7*f*. FIG. 10 presents plots for infinite array return loss (dB) versus frequency (GHz) for various configurations presented in FIGS. 7*a*-7*f*, and FIG. 11 presents plots for infinite array transmission (dB) versus frequency (GHz) for the various configurations presented in FIGS. 7*a*-7*f*. Plots 1010 and 1110 are for configuration 7*a*, coaxial filled aperture, and air filled regions on both sides, where the $\in_r$=1. Plots 1020 and 1120 are for configuration 7*b*, coaxial filled aperture connected to a coaxial waveguide, where the $\in_r$=1. Plots 1030 and 1130 are for configuration 7*c*, an enlarged air-filled aperture (3 mm) waveguide connected to a waveguide, where the $\in_r$=1. Plots 1040 and 1140 are for configuration 7*d*, waveguide filled aperture of 2.5 mm connected to a waveguide, where the $\in_r$=2. Plots 1050 and 1150 are for configuration 7*e*, waveguide filled aperture of 2 mm connected to a waveguide, where the $\in_r$=3. Plots

1060 and 1160 are for configuration 7*f*, waveguide filled aperture of 1 mm connected to a waveguide, where the $\in_r=12$.

Figure 12:
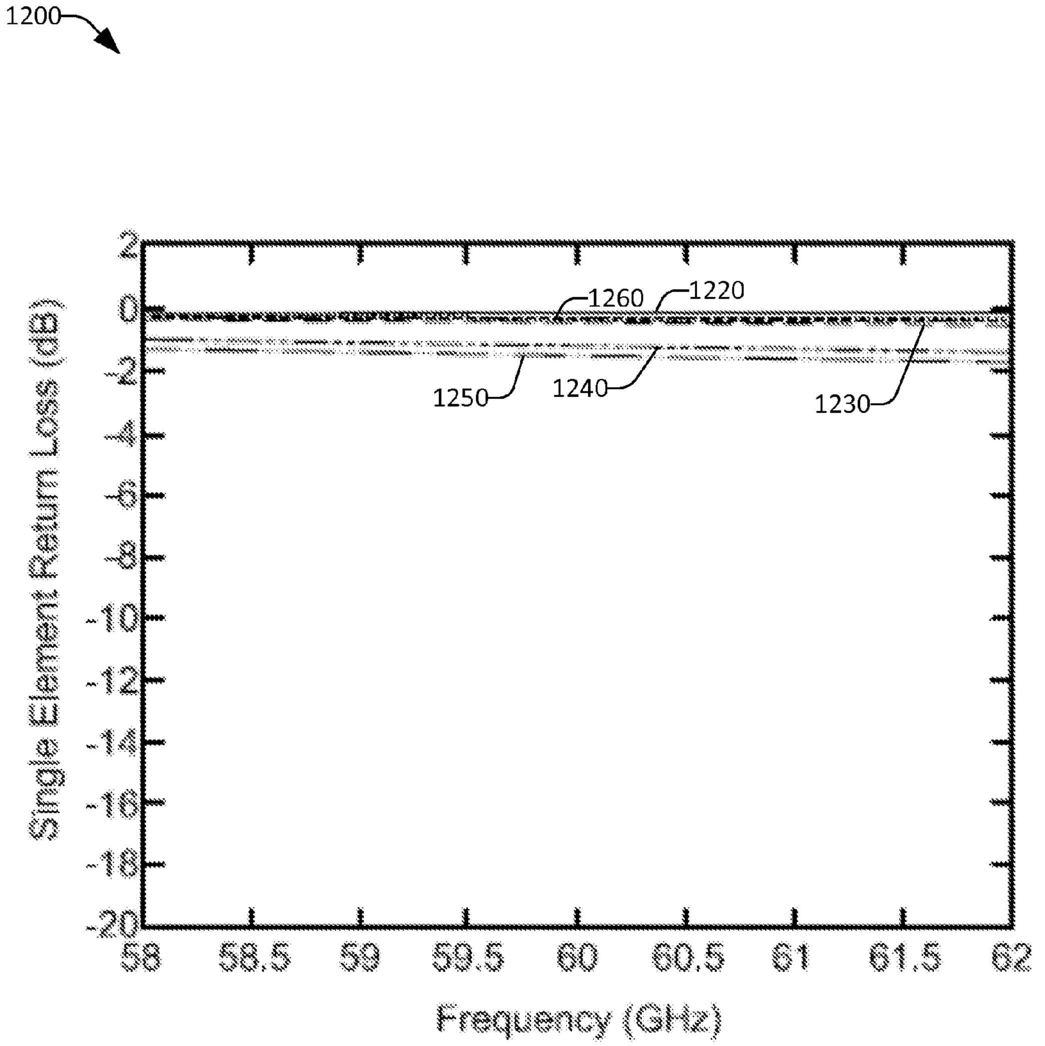
FIG. 12 presents return loss plots of a single evanescent element in an infinite plate for the evanescent apertures presented in FIGS. 6*b-f*.
Figure 13:
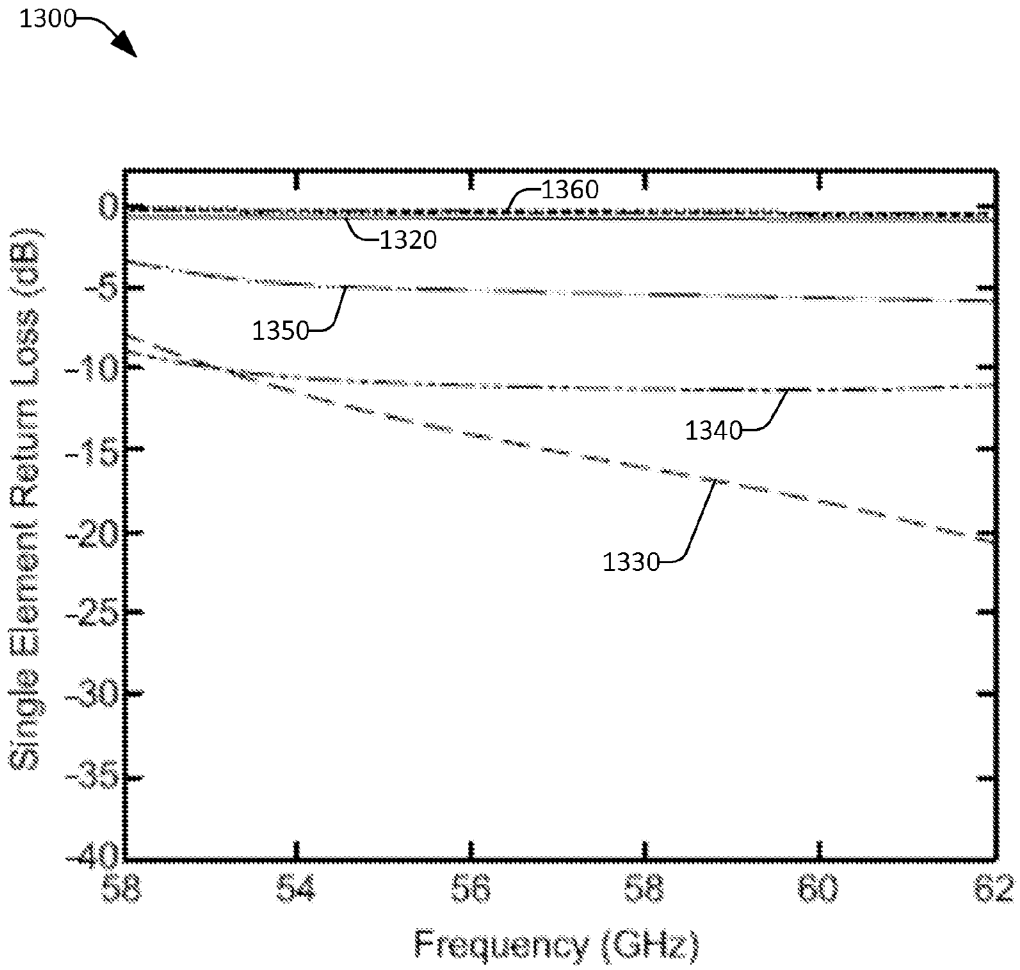
FIG. 13 presents return loss plots of a single propagating element in an infinite plate for the propagating apertures presented in FIGS. 7*b-f*.

FIGS. 12 and 13 present charts 1200 and 1300 depicting return loss results for cylindrical apertures in an infinite ground plane excited by the propagating waveguide presented in FIGS. 6*b*-6*f* and 7*b*-7*f*. FIG. 12 presents plots for single element return loss (dB) versus frequency (GHz) for various single evanescent element configurations presented in FIGS. 6*b*-6*f*, while FIG. 13 presents plots for single element return loss (dB) versus frequency (GHz) for the various single propagating element configurations presented in FIGS. 7*b*-7*f*. Plot 1220 is for configuration 6*b*, air filled aperture connected to a coaxial waveguide, where the $\in_r=1$. Plot 1230 is for configuration 6*c*, air filled aperture connected to a waveguide, where the $\in_r=1$. Plot 1240 is for configuration 6*d*, air filled aperture connected to a waveguide, where the $\in_r=2$. Plot 1250 is for configuration 6*e*, air filled aperture connected to a waveguide, where the $\in_r=3$. Plot 1260 is for configuration 6*f*, air filled aperture connected to a waveguide, where the $\in_r=12$.

Plot 1320 is for configuration 7*b*, coaxial filled aperture connected to a coaxial waveguide, where the $\in_r=1$. Plot 1330 is for configuration 7*c*, an enlarged air-filled aperture (3 mm) waveguide connected to a waveguide, where the $\in_r=1$. Plot 1340 is for configuration 7*d*, waveguide filled aperture of 2.5 mm connected to a waveguide, where the $\in_r=2$. Plot 1350 is for configuration 7*e*, waveguide filled aperture of 2 mm connected to a waveguide, where the $\in_r=3$. Plot 1360 is for configuration 7*f*, waveguide filled aperture of 1 mm connected to a waveguide, where the $\in_r=12$.

FIGS. 8 and 9 indicate that the same EEMT phenomenon occurs if the air on one side of the cutoff aperture is replaced by an array of propagating waveguides. As shown in FIGS. 8 and 9, resonant transmission can be seen at wavelengths larger than the period, and further, transmission peaks attenuate and shift higher in frequency with decreasing waveguide size and increasing relative dielectric constant of the waveguide filling. Per plot 820, EEMT is not observed for the case of cut-off cylindrical apertures fed by coaxial waveguides. This can be a function of a coaxial waveguide's fundamental mode does not couple to a fundamental mode of the cylindrical waveguide. However, high order coaxial TE11 mode does couple to the fundamental mode of the cylindrical waveguide and its EEMT response is shown by the dashed line 970 in FIG. 9. Furthermore, the transverse electromagnetic (TEM) coupling between adjacent coaxial waveguide openings excited in phase is low due to vector field cancellation. Comparison of FIG. 8 to FIG. 12 indicates that an array of evanescent apertures behaves as a narrow-band distributed matching circuit between air and each of its connected propagating waveguides. Accordingly, an evanescent element is, by itself, poorly matched; but is resonantly matched when placed in an infinite array.

Propagation behavior can change if the periodic apertures are altered to support a propagating mode. FIG. 11 does not show resonant behavior except for the plots 1110, where the waveguide is free space. FIG. 10 shows mismatch increases with decreasing waveguide size and increasing relative dielectric constant of the waveguide filling. A similar trend is observed for the case of a single propagating aperture situated in an infinite ground plane (per FIG. 13).

While the foregoing has been directed towards compound unit cells comprising periodic arrays of disparately sized apertures, as well as utilizing cover material (e.g., a dielectric) over one of more apertures in a periodic array, the concept for a first component having a first dimension to affect (or be affected by) a second component having a second dimension, can be utilized to address transmission effects, e.g., mutual coupling, in an antenna. Such an effect is antenna-array resonance(s) which can occur when patch antennas are combined to form an array antenna (e.g., a semi-infinite or an infinite periodic array environment). For example, a periodic array can be formed from one or more first antenna elements having a first antenna dimension periodically interspersed with one or more second antenna elements having a second antenna dimension.

Figure 14:
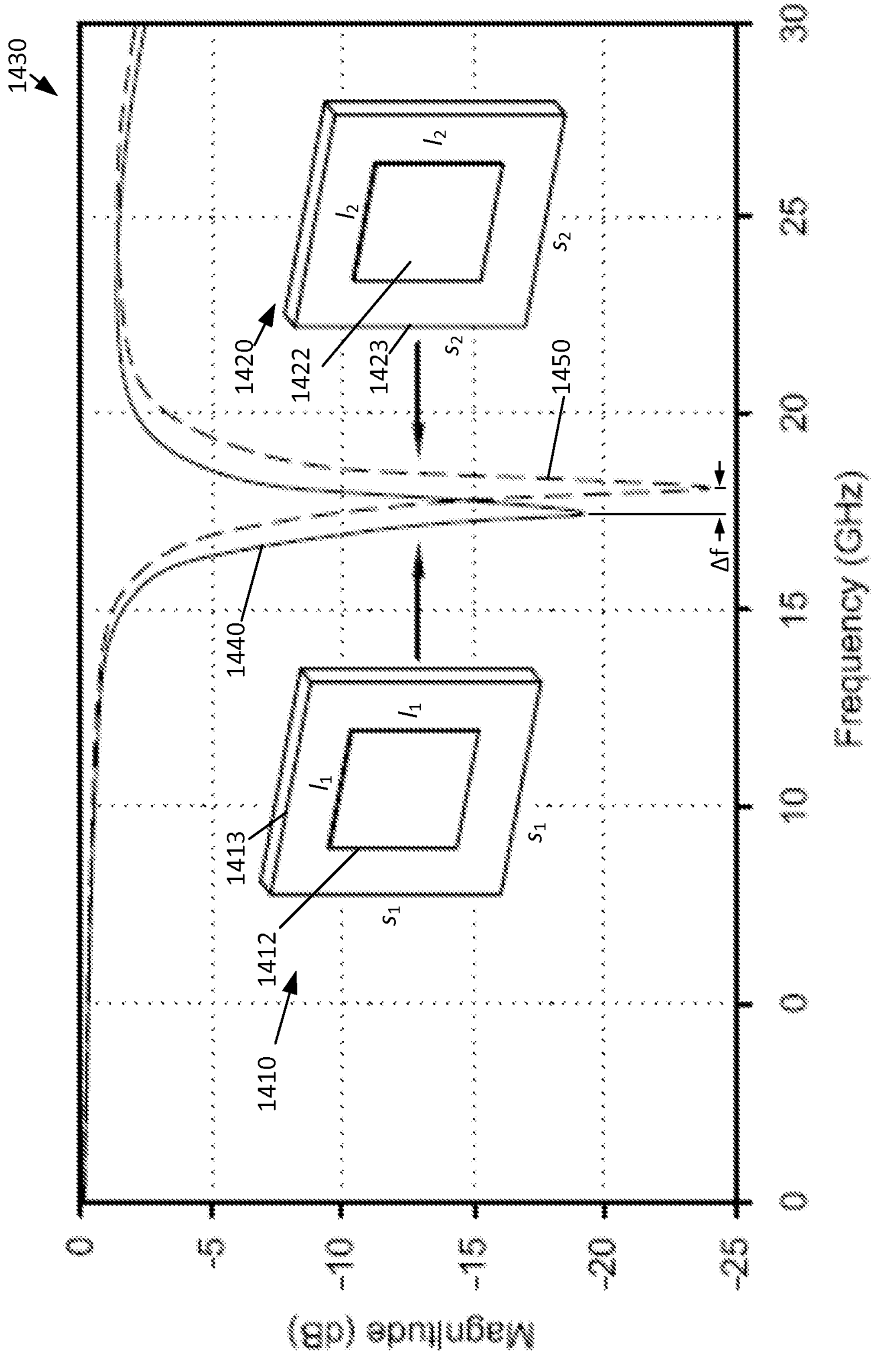
FIG. 14 presents exemplary patch antenna configurations having dissimilar sizes, and return loss results for the respective patch antenna configurations.

FIG. 14 illustrates a first antenna 1410 and a second antenna 1420, and a chart 1430 of return loss for each antenna 1410 and 1420. In an embodiment, the first antenna 1410 can have a first element 1412 located on a first support 1413, and the second antenna 1420 can have a second element 1422 located on a second support 1423, whereby the first element 1412 and the second element 1422 can be of different dimensions. For example, per the respective plots 1440 and 1450 presented in FIG. 14, the first antenna 1410 comprises a first element 1412 having side dimensions $l_1$, located on a first support 1413 having side dimensions $s_1$, whereby in the example embodiments $l_1=5.2$ mm and $S_1=9$ mm. Further, the second antenna 1420 comprises a second element 1422 having side dimensions $l_2$, located on a second support 1423 having side dimensions $s_2$, whereby in the example embodiments $l_2=5$ mm and $s_2=9$ mm. In the example embodiment, supports 1413 and 1423 are fabricated from a dielectric ROGERS/DUROID 5880 having an $\in_r=2.2$.

Plot 1440 presents the return loss for the first antenna 1410, while plot 1450 presents the return loss for the second antenna 1420. As shown in FIG. 14, narrow-band resonance is exhibited, with the second antenna 1420 having the smaller element 1422 resonating at a frequency of 18.211 GHz and the first antenna 1410 having the larger element 1412 resonating at a slightly lower frequency of 17.532 GHz. A frequency difference, $\Delta f$, between the first antenna 1410 and the second antenna 1420 is 0.679 GHz.

Figure 15:
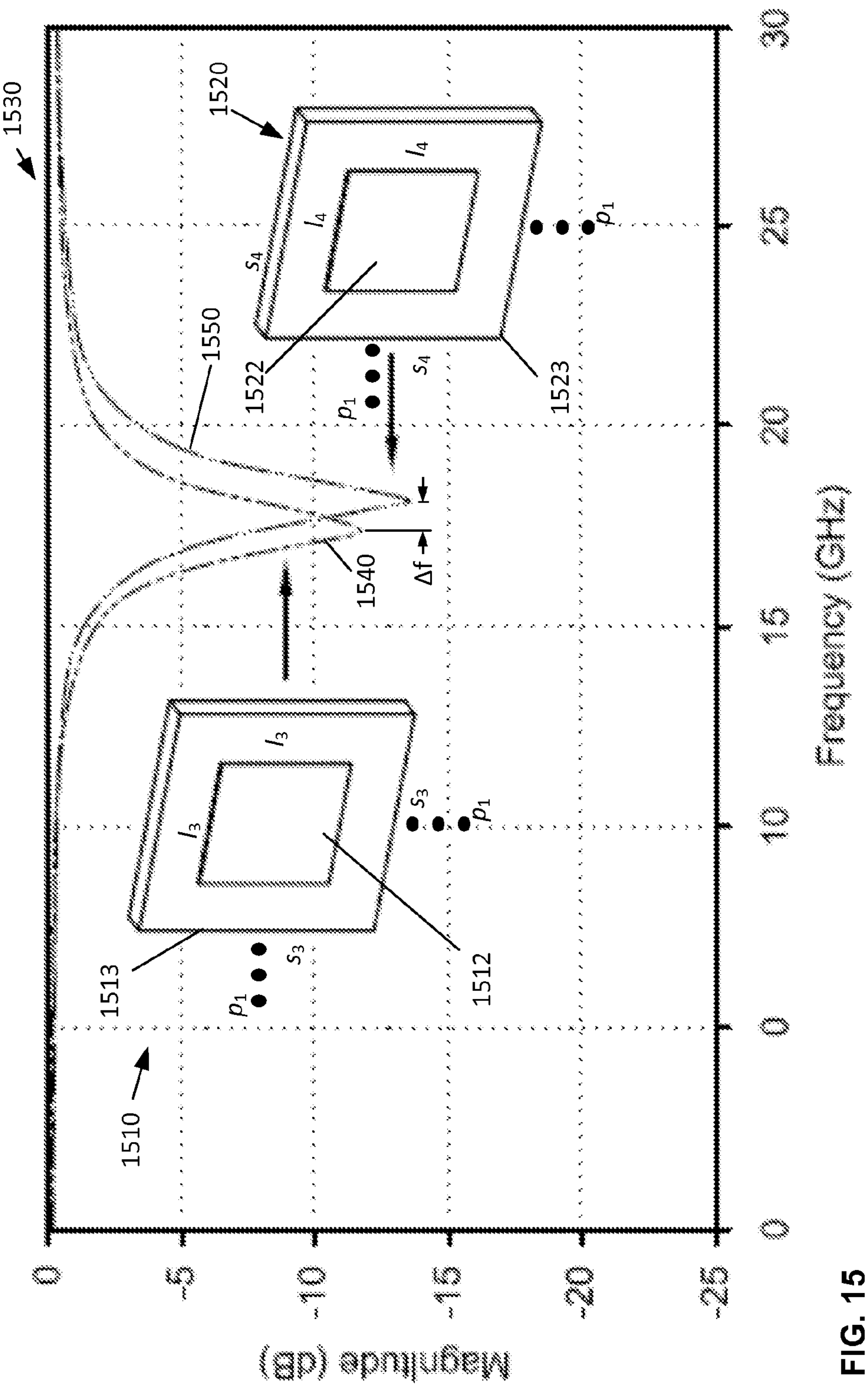
FIG. 15 presents exemplary patch antenna configurations having dissimilar sizes, and return loss results for the respective patch antenna configurations when the patch antenna configurations are placed within an infinite array.

FIG. 15 illustrates a first antenna 1510 and a second antenna 1520, and a chart 1530 of return loss for each antenna 1510 and 1520 when placed in an infinite rectangular-periodic array, wherein the periodicity is $p_1$. In an embodiment, the first antenna 1510 can have a first element 1512 located on a first support 1513, and the second antenna 1520 can have a second element 1522 located on a second support 1523, whereby the first element 1512 and the second element 1522 can be of different dimensions. For example, per the respective plots 1540 and 1550 presented in FIG. 15, the first antenna 1510 comprises a first element 1512 having side dimensions $l_3$, located on a first support 1513 having side dimensions $s_3$, whereby in the example embodiments $l_3=5.2$ mm and $s_3=9$ mm. Further, the second antenna 1520 comprises a second element 1522 having side dimensions $l_4$, located on a second support 1523 having side dimensions $s_4$, whereby in the example embodiments $l_4=5$ mm and $s_4=9$ mm. In the example embodiment, supports 1513 and 1523 are fabricated from a dielectric ROGERS/DUROID 5880 having an $\in_r=2.2$.

Plot 1540 presents the return loss for the first antenna 1510, while plot 1550 presents the return loss for the second antenna 1520. As shown in FIG. 15, narrow-band resonance is exhibited, with the second antenna 1520 having the smaller element 1522 resonating at a frequency of 18.274 GHz and the first antenna 1510 having the larger element 1512 resonating at a slightly lower frequency of 17.509 GHz. $\Delta f$, between the first antenna 1510 and the second antenna 1520 is 0.765 GHz. No other resonances occur between the 0 GHz to 30 GHz range.

Figure 16:
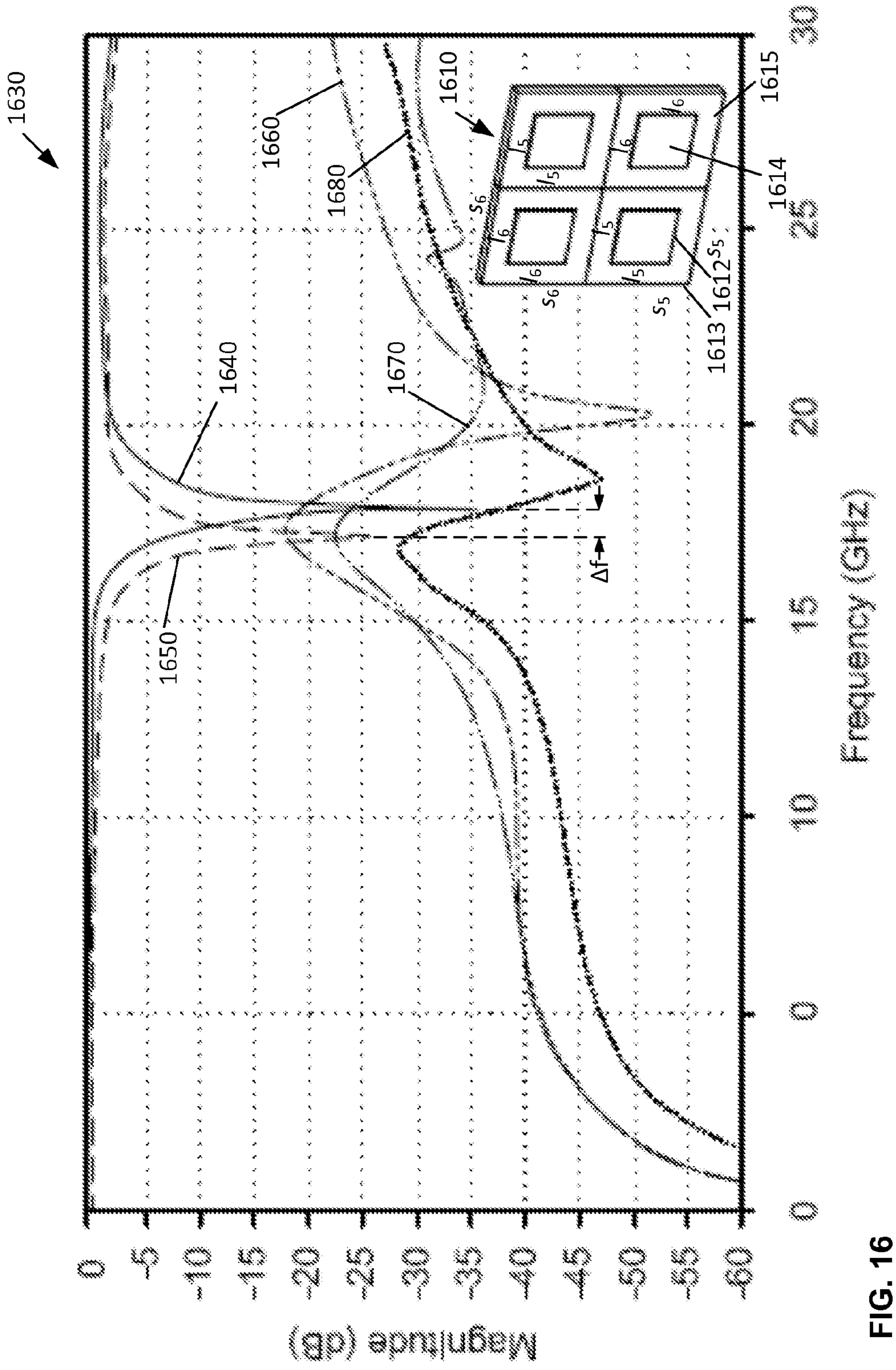
FIG. 16 presents an exemplary patch antenna comprising a plurality of antenna elements, and a chart presenting return loss and insertion loss results for the patch antenna.

Turning to FIG. 16, a four element array 1610 is presented in conjunction with chart 1630, whereby array 1610 comprises a first pair of patch antennas 1612 (e.g., patch antennas 1 and 4) having side dimensions $l_5$, located on first supports 1613 having side dimensions $s_5$, whereby in the example embodiments $l_5$=5.2 mm and $s_5$=9 mm. Further, the array 1610 further comprises a second pair of patch antennas 1614 (e.g., patch antennas 2 and 3) having side dimensions $l_6$, located on second supports 1615 having side dimensions $s_6$, whereby in the example embodiments $l_6$=5 mm and $s_6$=9 mm. In the example embodiment, supports 1613 and 1615 are fabricated from a dielectric ROGERS/DUROID 5880 having an $\in_r$=2.2.

Plot 1640 presents the port 2 and 3 return losses, e.g., S22 and S33, having a resonance of 18.073 GHz. Plot 1650 presents port 1 and 4 return losses, e.g., S11 and S44, having a resonance of 17.344 GHz. Δf, between the return losses of ports 2 and 3, and the return losses of 1 and 4 is 0.729 GHz. Plot 1660 is the insertion loss for S21, plot 1670 is the insertion loss for S31, and plot 1680 is the insertion loss for S41.

Figure 17:
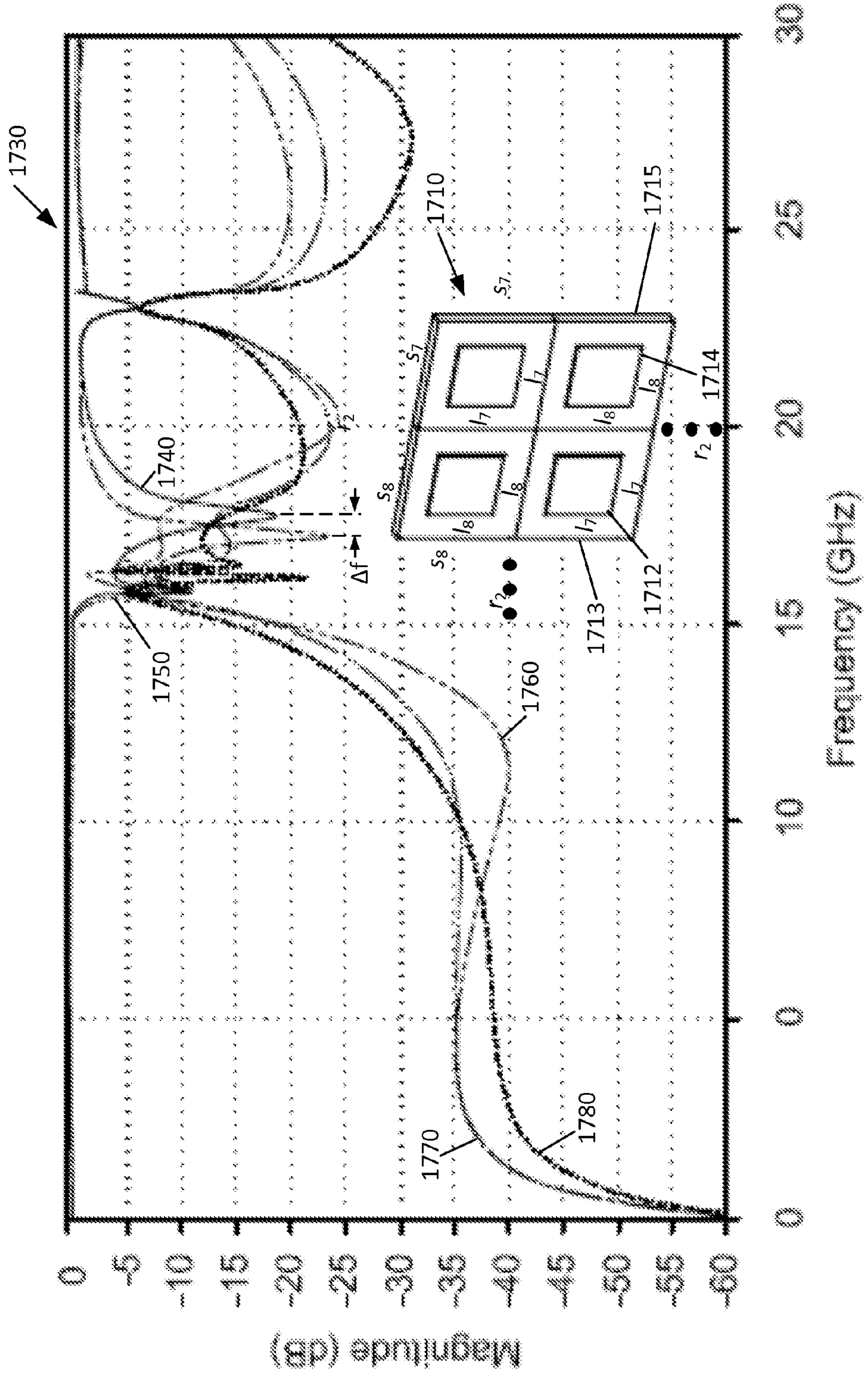
FIG. 17 presents an exemplary patch antenna comprising a plurality of antenna elements placed in an infinite array, and a chart presenting return loss and insertion loss results for the patch antenna.

Turning to FIG. 17, a unit cell comprising a four element array 1710 is presented in conjunction with plot 1730, whereby array 1710 is placed in an infinite array environment, wherein the array has an orthogonal periodicity spacing(s) of $r_2$. The unit cell 1710 comprises a first pair of patch antennas 1712 (e.g., patch antennas 1 and 4) having side dimensions $l_7$, located on first supports 1713 having side dimensions $s_7$, whereby in the example embodiments $l_7$=5.2 mm and $s_7$=9 mm. Further, the array 1710 further comprises a second pair of patch antennas 1714 (e.g., patch antennas 2 and 3) having side dimensions $l_8$, located on second supports 1715 having side dimensions $s_8$, whereby in the example embodiments $l_8$=5 mm and $s_8$=9 mm. In the example embodiment, supports 1713 and 1715 are fabricated from a dielectric ROGERS/DUROID 5880 having an $\in_r$=2.2. With the dimensions $s_7$ and $s_8$ both being 9 mm, $r_2$=18 mm, whereby the unit cell 1710 encompasses all four elements and occupies an area of 18×18 mm.

Plot 1740 presents patch antenna total loss for the four-element antenna 1710 when placed in an infinite rectangular-periodic array with $r_2$=18 mm. Plot 1740 presents the port 2 and 3 return losses, e.g., S22 and S33, having a resonance of 17.953 GHz. Plot 1750 presents port 1 and 4 return losses, e.g., S11 and S44, having a resonance of 17.386 GHz. Δf, between the return losses of ports 2 and 3, and the return losses of 1 and 4 is 0.567 GHz. Plot 1760 is the insertion loss for S21, plot 1770 is the insertion loss for S31, and plot 1780 is the insertion loss for S41.

Figure 18:
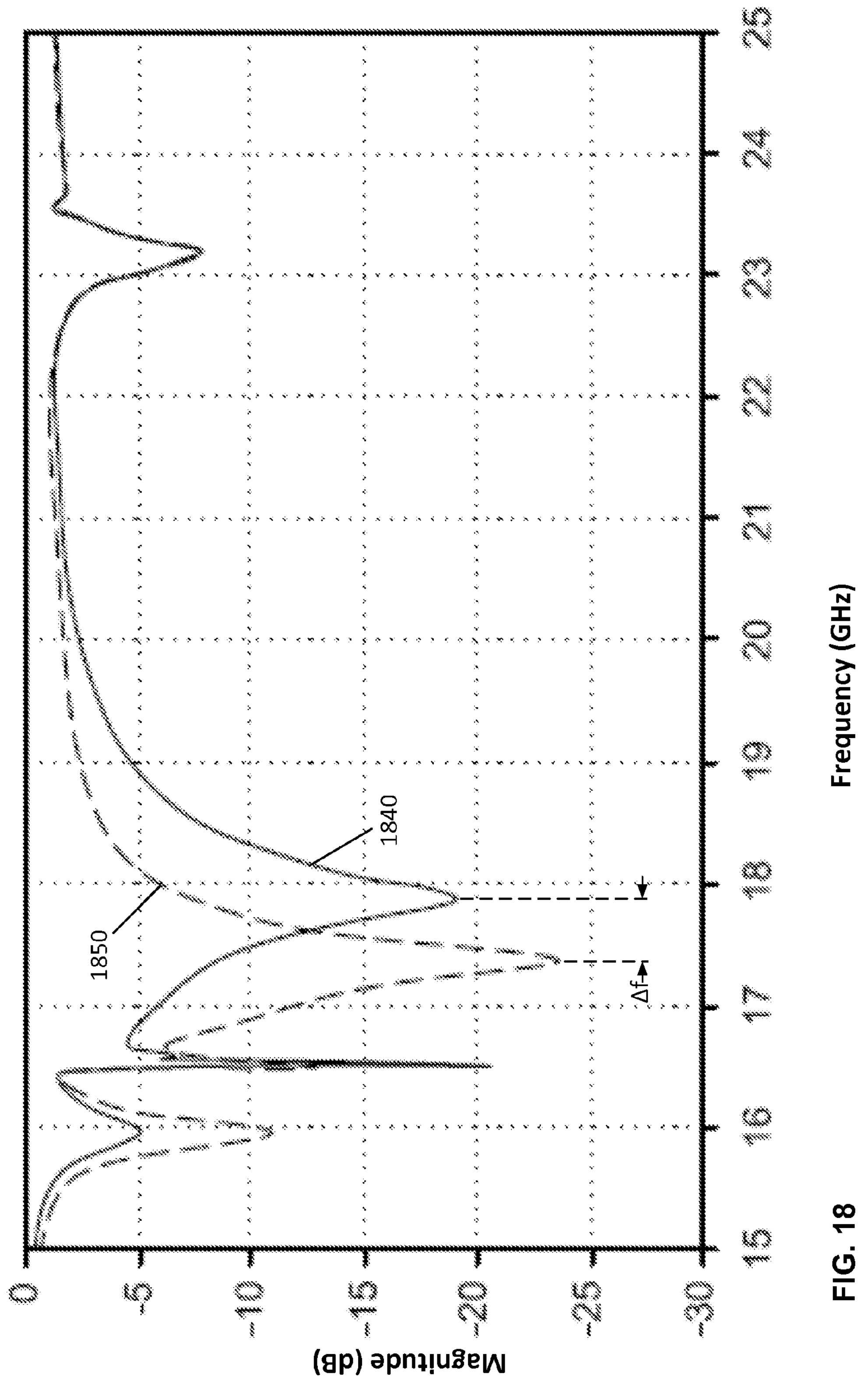
FIG. 18 presents a chart depicting return loss results for the patch antenna of FIG. 17.

FIG. 18 is a zoomed portion of FIG. 17, between 15-25 Ghz. Plot 1840 is a zoomed portion of the return loss plot 1740 for ports 2 and 3, e.g., S22 and S33, and 1850 is a zoomed portion of the return loss plot 1750 for ports 1 and 4, e.g., S11 and S44. As shown, while two main resonances occur at 17.386 GHz and 17.953 GHz respectively, other resonances are also present at about 16 GHz, about 16.5 GHz, and about 23.2 GHz.

Figure 19:
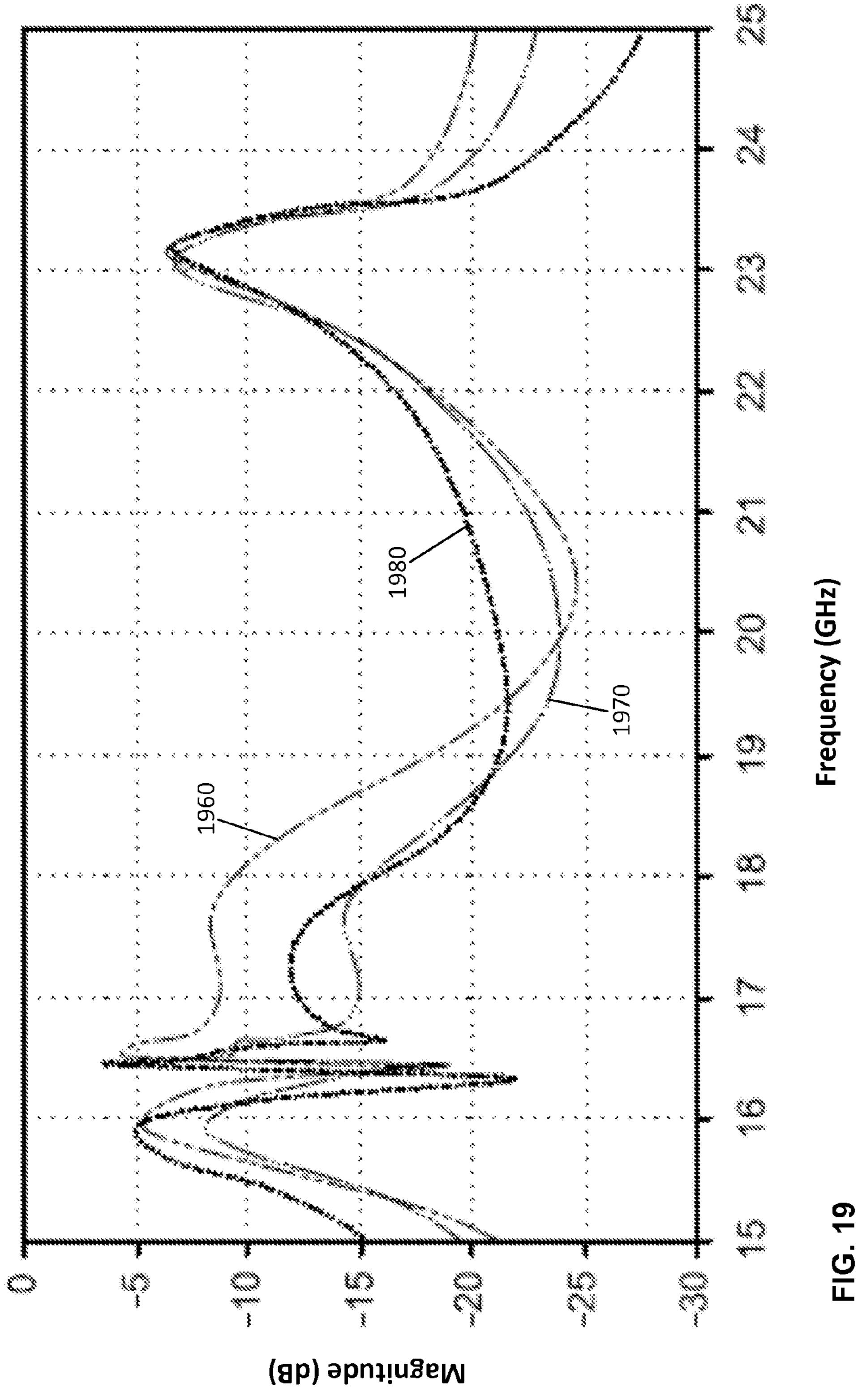
FIG. 19 presents a chart depicting insertion loss results for the patch antenna of FIG. 17.

FIG. 19 is a zoomed portion of FIG. 17, between 15-25 Ghz. Plot 1960 is a zoomed portion of the insertion loss plot 1760 for S21, plot 1970 is a zoomed portion of the insertion loss plot 1770 for S31, and plot 1980 is a zoomed portion of the insertion loss plot 1780 for S41. As shown by plots 1960, 1970, and 1980, the additional resonances presented in FIGS. 18 and 19 can occur as a result of mutual coupling within an infinite array comprising the four element array 1710. Accordingly, as shown in the foregoing, an element array which comprises array elements having a dissimilar size (e.g., side dimension, area, etc.) can engender mutual coupling which can form new matched frequency regions.

Figure 20:
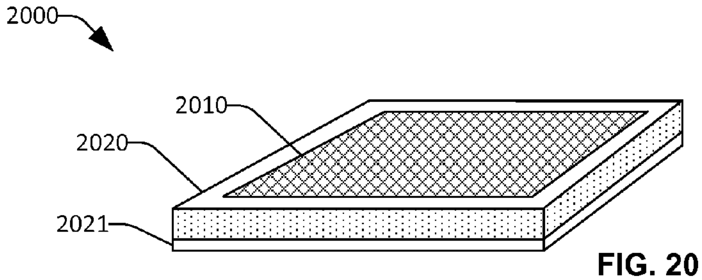
FIG. 20 illustrates an exemplary configuration for a single element antenna.
Figure 21:
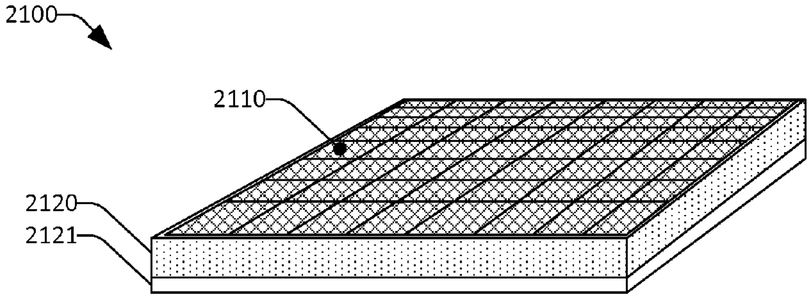
FIG. 21 illustrates an exemplary configuration for an array antenna.
Figure 22:
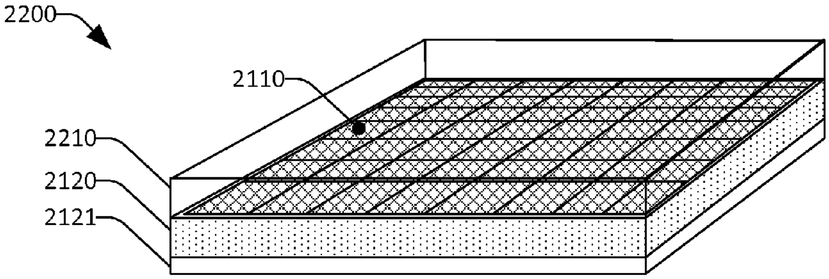
FIG. 22 illustrates an exemplary configuration for an array antenna which includes a cover layer.

FIG. 20 illustrates a single element 2000 comprising an element 2010 and a substrate 2020 with ground plane 2021. FIG. 21 illustrates a unit cell 2100 comprising a plurality of elements 2110 located on a substrate 2120 with a ground plane 2121. In an exemplary embodiment, an 8×8 array of elements 2110 can be formed. FIG. 22 illustrates a unit cell 2200 comprising a plurality of elements 2110 located on a substrate 2120 and a ground plane 2121, whereby the elements 2110 (e.g., comprising an 8×8 array) are covered with a cover layer 2210. In an embodiment, the cover layer 2210 can be formed from any suitable material, e.g., a dielectric. In an example embodiment (as presented in FIG. 23), the substrates 2020 and 2120 can be formed from ROGERS/DUROID 5880, 20 mil thick, with an $\in_r$=2.2, while the cover layer 2210 can be a dielectric material 20 mil thick with an $\in_r$=10.

Figure 23:
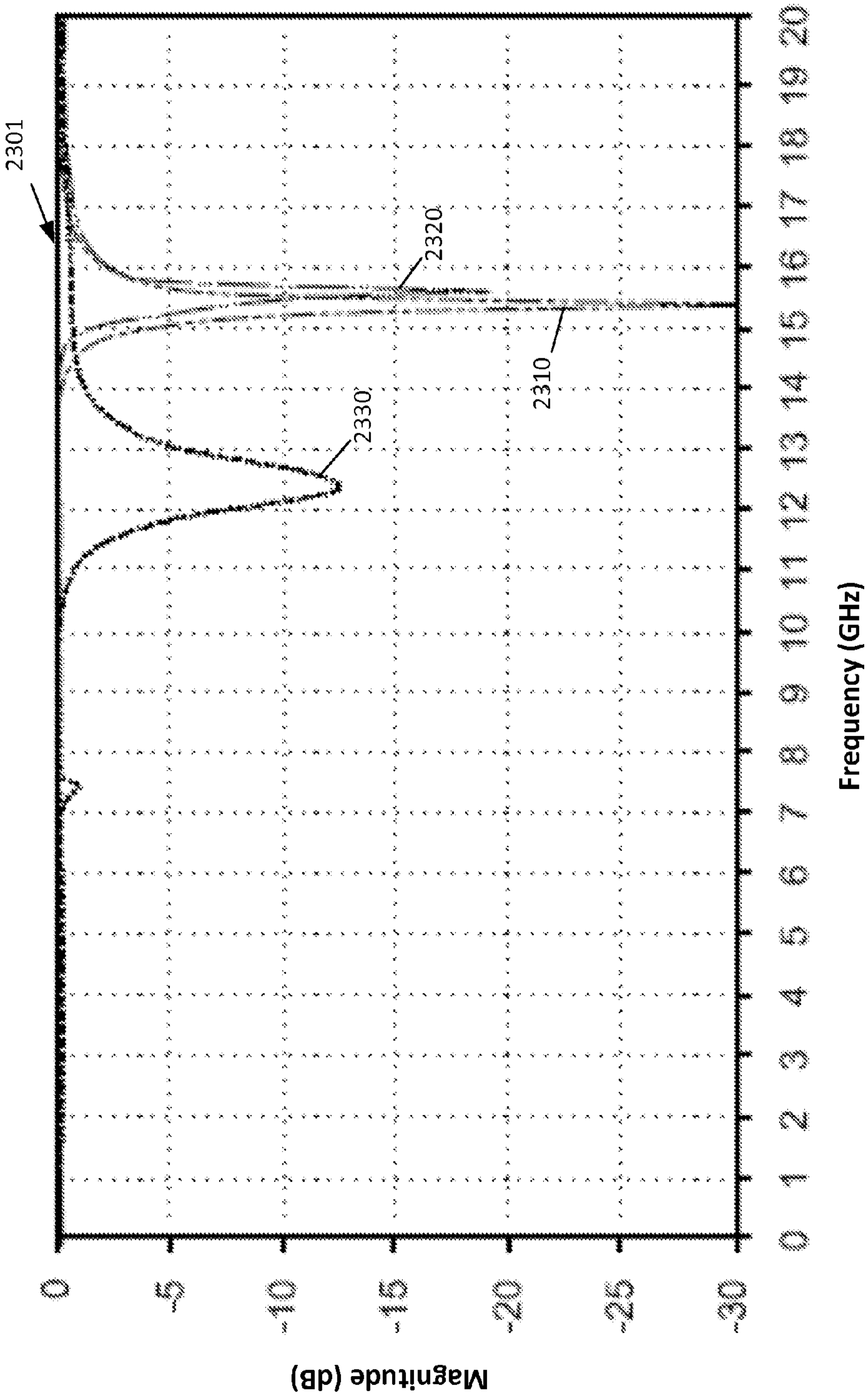
FIG. 23 presents a chart depicting return loss results for the configurations presented in FIGS. 20, 21, and 22.

FIG. 23, presents return loss plots for the configurations 2000, 2100, and 2200. Plot 2310 is a plot of return loss for the single element 2000, plot 2320 is a plot of return loss for a single element duplicated into the 8×8 array 2100, and plot 2330 is a plot of return loss for configuration 2200 which includes the cover layer 2210. As shown in plots 2310 and 2320, the return loss for the single element 2000 and the array 2100 are similar at about 15.6 GHz. However, with the cover layer 2210 of configuration 2200, the resonance shifts from about 15.6 GHz for configurations 2000 and 2100, to about 12.5 GHz.

Figure 24:
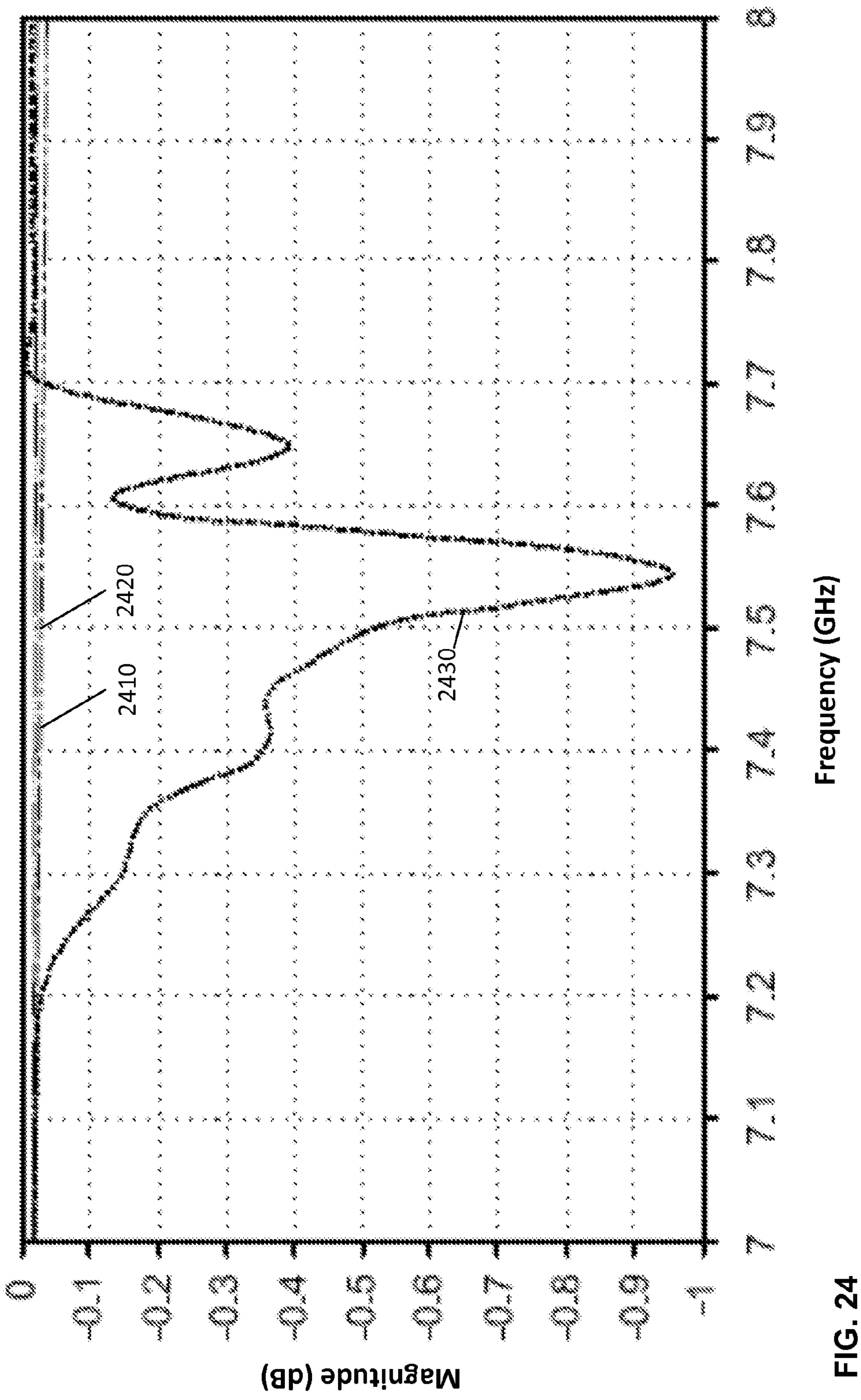
FIG. 24 presents a chart depicting return loss results for the configurations presented in FIGS. 20, 21, and 22.

FIG. 24 presents a chart 2401 of frequency versus signal magnitude, wherein FIG. 24 is a zoomed portion between 7-8 GHz of FIG. 23. Plot 2410 is the return loss measured for the single element 2000, plot 2420 is the return loss measured for the array 2100, and plot 2430 is the return loss measured for the covered array 2200. As shown in FIG. 24, an additional resonance located at 7.5 GHz is evident for the covered array 2200.

While not shown in combination, it is to be appreciated that any of configurations 100, 200, 400, 1410, 1420, 1510, 1520, 1610, 1710, 2000, 2100, and/or 2200 can be connected to any of the various waveguide configurations presented in FIGS. 6*a*-6*f* and 7*a*-7*f*. Accordingly, any of the patch or antenna elements presented in the configurations 100, 200, 400, 1410, 1420, 1510, 1520, 1610, 1710, 2000, 2100, and/or 2200 can be driven and/or excited by signaling transmitted in conjunction with the various waveguide configurations presented in FIGS. 6*a*-6*f* and 7*a*-7*f*.

Figure 25:
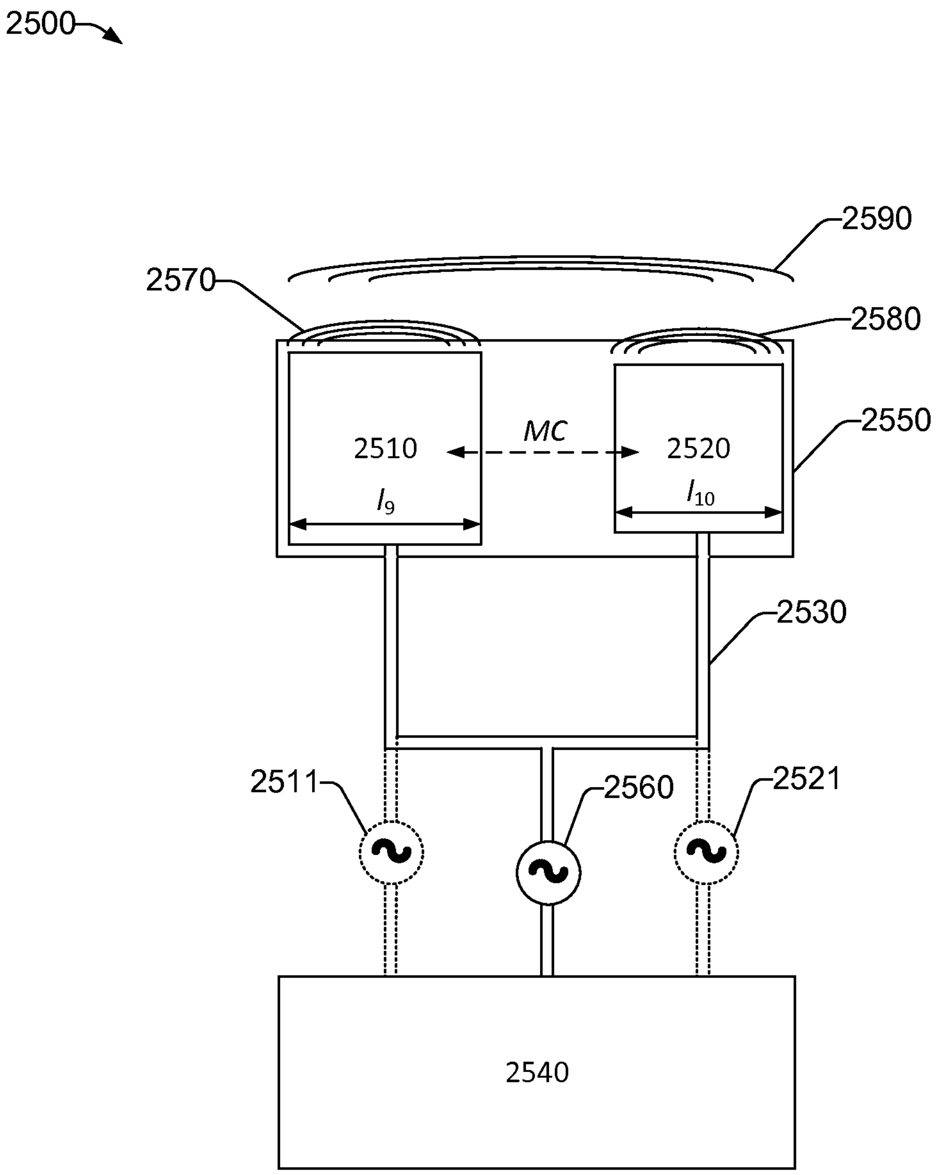
FIG. 25 illustrates an exemplary configuration for an array antenna.

FIG. 25 illustrates a system 2500 configured to operate at a frequency (e.g., an excitation frequency, or third frequency) which is different to a first frequency normally utilized for a first antenna element having a first size and also different to second frequency normally utilized for a second antenna element having a second size, wherein the first antenna element and the second antenna element are included in an antenna array. The first frequency, the second frequency and the third frequency are different.

A first antenna element 2510 and a second antenna element 2520 are connected, via a feed network 2530, to a signal generation system 2540. As previously described, the first antenna element 2510 can have at least one dimension that is different to a comparable dimension of the second antenna element 2520. For example, a width $l_9$, of the first antenna element 2510 can be longer than a width $l_{10}$ of the second antenna element 2520. The first antenna element 2510 and the second antenna element 2520 can be rectangular, hence the first antenna element 2510 can have a radiating area of $l_9 \times l_9$, and the second antenna element 2510 can have a radiating area of $l_{10} \times l_{10}$. The first antenna element 2510 and the second antenna element 2520 can be located on a ground plane 2550, whereby a supporting substrate (not shown) can be located between the antenna elements 2510 and 2520 and the ground plane 2550. The substrate can be a dielectric.

As shown in FIG. 25, the first antenna element 2510 is conventionally driven by a first excitation frequency 2511 (per the hashed line), while the second antenna element 2520 is conventionally driven by a second excitation frequency 2521 (per the hashed line), wherein frequencies 2511 and 2521 are of different magnitudes.

As previously described, owing to a mutual coupling MC effect between the first antenna element 2510 and the second antenna element 2520, both the first antenna element 2510 and the second antenna element 2520 can be simultaneously driven by a common excitation signal 2560 generated at the signal generation system 2540. The excitation signal 2560 can have a different frequency to the first excitation frequency 2511 and the second excitation frequency 2521. Upon excitation of the first antenna element 2510 with the excitation signal 2560, the first antenna element 2510 can resonate at a resonant frequency 2570. Upon excitation of the second antenna element 2520 with the excitation signal 2560, the second antenna element 2520 can resonate at a resonant frequency 2580 (e.g., a third frequency), wherein the resonant frequencies 2570 and 2580 can be the same, even though the respective dimensions $l_9$ and $l_{10}$ are different. Mutual coupling MC can occur between the first antenna element 2510 and the second antenna element 2520. Accordingly, the first antenna element 2510 can couple with the second antenna element 2520 such that a signal 2590 can be transmitted even if the frequency of the excitation signal 2560 were neither the resonant frequency 2511 of the first antenna element 2510 nor the resonant frequency 2521 of the second antenna element.

It is to be appreciated that while FIG. 25 only illustrates two antenna elements, 2510 and 2520, a plurality of antenna elements can be utilized in system 2500, such as the plurality of antenna elements presented in configurations 1600, 1700, 2100, and 2200. Further, by enabling antenna elements to operate with a wavelength longer than the wavelength required if operated in isolation, an antenna array can be fabricated, with mismatched antenna elements, having a smaller footprint than an antenna array that utilized same-sized and matched antenna elements. Accordingly, per the various embodiments herein, a long wavelength signal can be transmitted with an antenna array that is smaller than an array conventionally utilized for transmission of longer wavelength signals.

Figure 26:
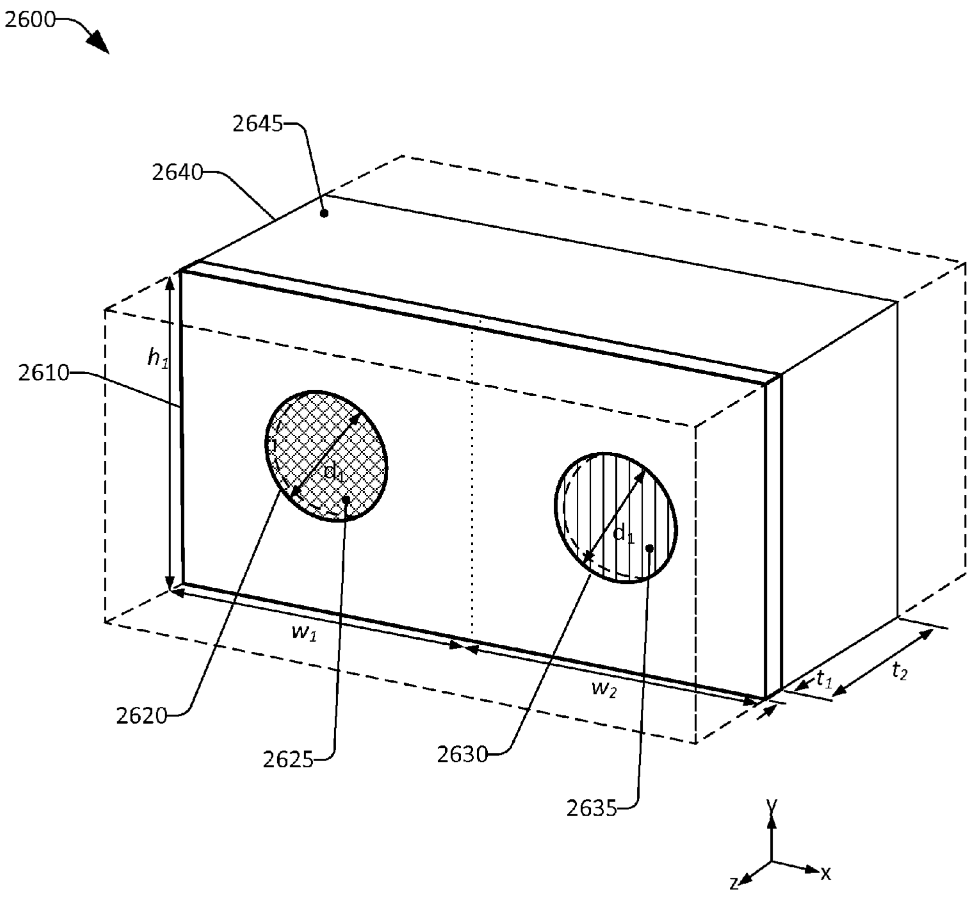
FIG. 26 illustrates an exemplary configuration for a compound unit cell comprising different dielectric materials.

FIG. 26 illustrates configuration 2600, whereby FSS compound unit-cell 2610 includes a pair of apertures 2620 and 2630 having the same diameter, however, the aperture 2620 is filled with a first dielectric material 2625 while the aperture 2630 is filled with a second dielectric material 2635, wherein materials 2625 and 2635 can have different dielectric constants, i.e. permittivity $\in_r$ or permeability $\mu_r$. In an embodiment, a cover layer 2640 can be added to one side of a plate 2610, whereby material 2645 forming the cover layer 2640 can be the same as one of the materials 2625 or 2635, or a different material. In a configuration where two apertures (e.g., apertures 2620 and 2630) having the same diameter (and thickness) but filled with different materials (e.g., materials 2625 and 2635) are utilized in a compound unit-cell, Eqn. 1 becomes:

$$e^{-j\beta(\lambda_0(\sqrt{\varepsilon_r \cdot \mu_r}))} = e^{-j\left(-\sqrt{(2\pi)^2 - \left(\frac{1.841\times 2}{d/(\lambda_0(\sqrt{\varepsilon_r \cdot \mu_r}))}\right)^2}\right)} \qquad \text{Eqn. 5}$$

Figure 27:
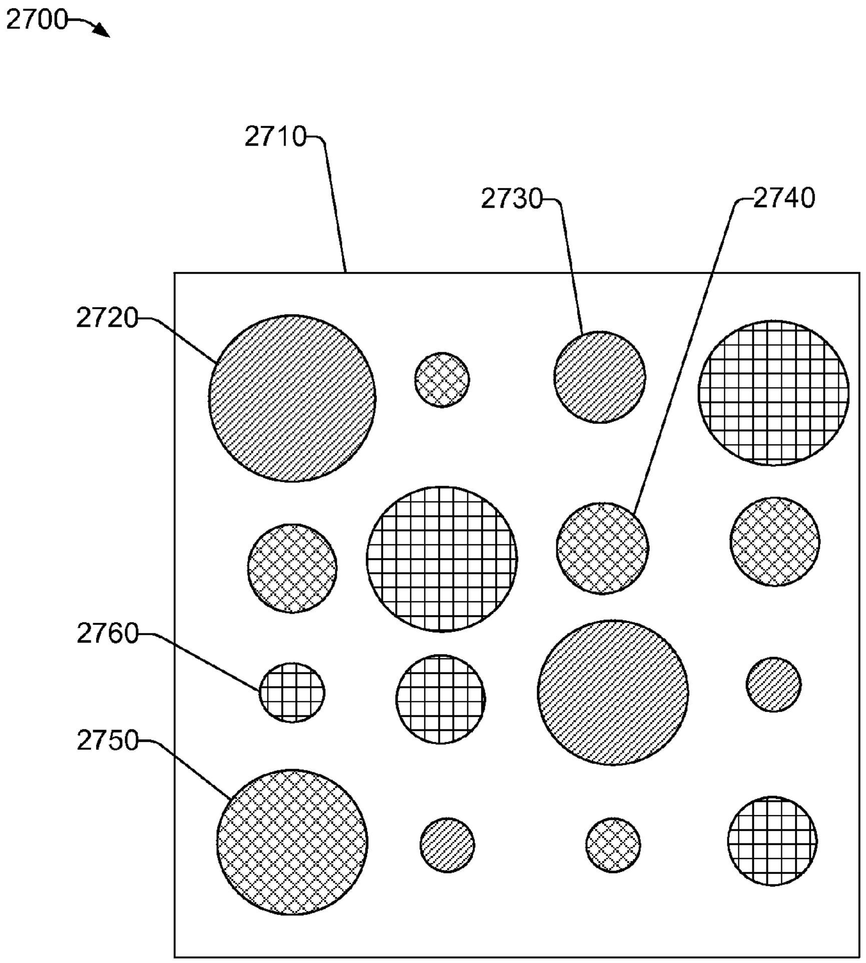
FIG. 27 illustrates an exemplary configuration for a compound unit cell comprising a plurality of disparate apertures and fill materials.

FIG. 27 illustrates a FSS array comprising a compound unit-cell 2710 comprising an arrangement of a plurality of apertures. As shown, in an embodiment, the apertures can be of various sizes, and further, can be filled with different materials (e.g., different materials having different dielectric constants). As shown, apertures 2720 and 2730 are of different diameters but filled with a common material. Apertures 2730 and 2740 have a similar diameter but are filled with different materials. Apertures 2740 and 2750 are of different diameters but filled with the same material, while aperture 2760 is of a different diameter and filled with different material. Mutual coupling between the apertures (e.g., as a function of aperture diameter(s) and aperture material(s) can enable an excitation frequency to be utilized with the FFS array 2710, whereby the excitation frequency would be inefficient if utilized with any of the apertures in isolation, as previously mentioned. The unit-cell 2710 can be repeated in the x and y directions. It is to be appreciated that a compound unit-cell such as configuration 2700 can comprise of any number of n apertures, where n is a positive integer of 2 or greater.

Further, while not shown, a first cover layer can be placed on a first surface (e.g., a front surface) of the FFS array 2710, and a second cover layer can be placed on a second surface (e.g., a back surface) of the FFS array 2710. Application of the first cover layer and/or the second cover layer can further enable an excitation frequency to be utilized with the array FFS 2710, whereby the excitation frequency would be inefficient if utilized with any of the apertures in isolation.

While not shown, it is to be appreciated that an array can assembled comprising a variety of array elements to engender dissimilarity such that an excitation frequency for the array is sufficiently disparate to excitation frequencies utilized when each array element is excited in isolation. The variety of array elements can comprise of apertures of various sizes (e.g., similar and/or different diameters), filled with different or similar dielectric materials, as well as being excited by a generator source on one side and free-space on another, or free-space on both sides. Antenna elements of various sizes and materials can also be utilized in the array. Further, material selection (e.g., as a function of dielectric constant) and/or thickness for a ground plane and/or substrate material can also be based upon a required mutual coupling between array elements.

Figure 28:
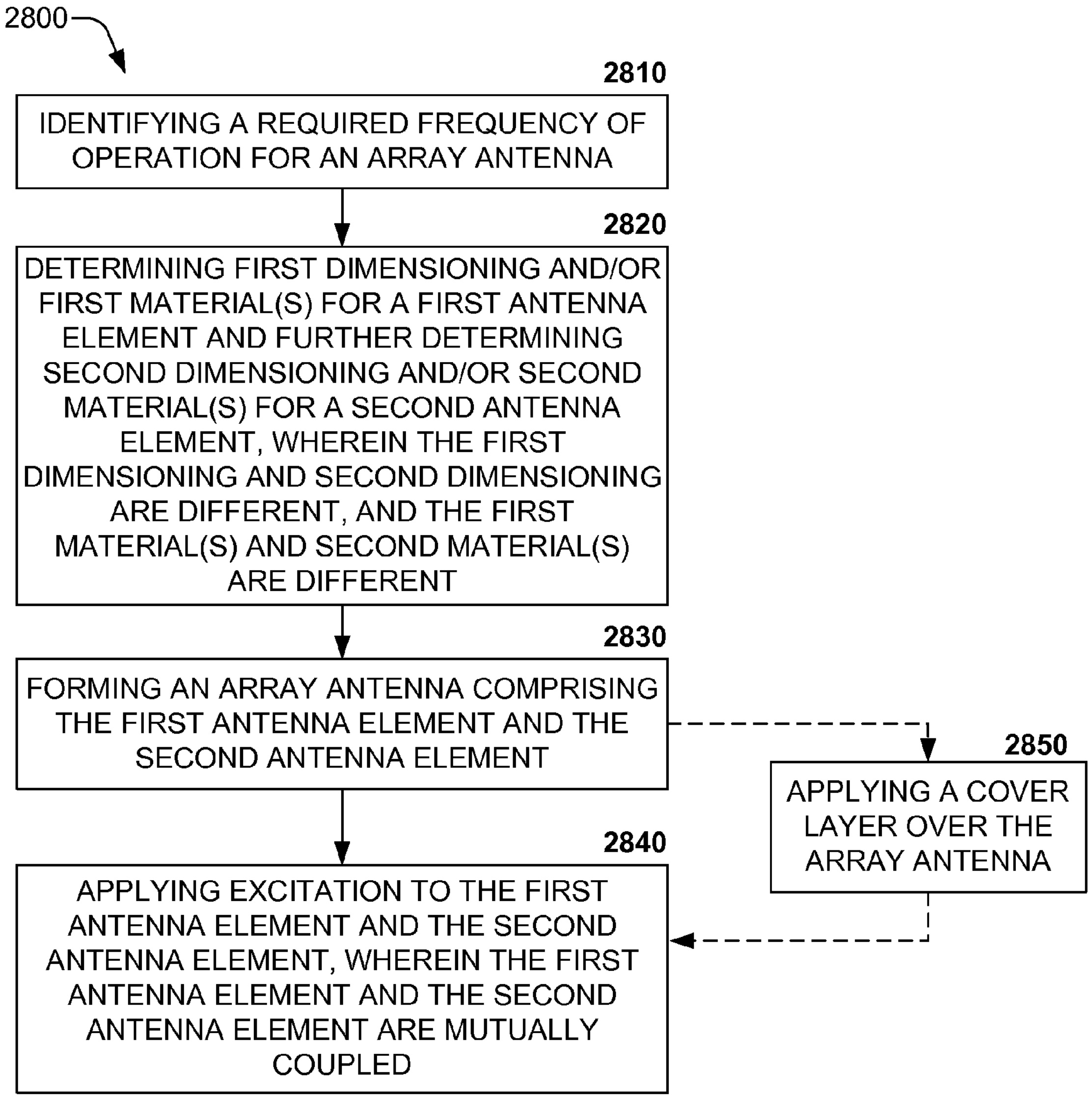
FIG. 28 is a flow diagram illustrating an exemplary methodology for operating an antenna array at frequencies that are significantly lower than the expected frequencies of operation of individual antenna elements included in the antenna array.
Figure 29:
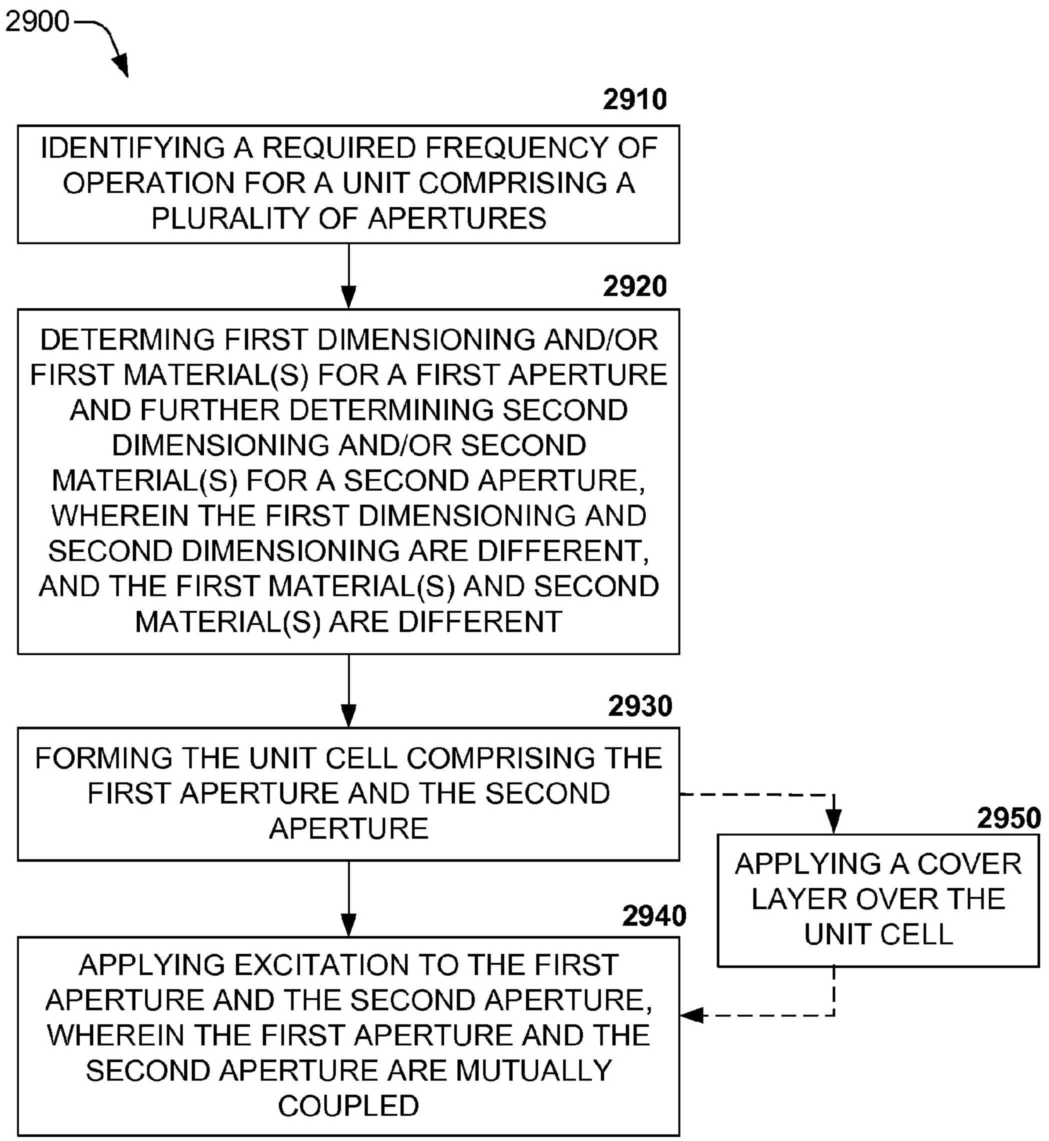
FIG. 29 is a flow diagram illustrating an exemplary methodology for operating a frequency selective surface with a frequency that is different to frequencies of operation of the individual apertures included in the frequency selective surface.

FIGS. 28 and 29 illustrate exemplary methodologies relating to shifting and/or lowering the expected patch or aperture array operational frequencies by varying their physical size. While the methodologies are shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodologies described herein.

It is to be appreciated that while the methodologies are shown and described as varying the physical size, it is to be understood and appreciated that the methodology can be directed towards altering an electrical size of an antenna element(s) by changing its material makeup, e.g., filling identical apertures with different dielectrics and/or using identical sized antenna patches over different substrates (as previously described).

FIG. 28 illustrates a methodology 2800 relating to utilizing dissimilar radiating elements to create distributed matching of radar signaling.

At 2810, a required frequency of operation for an array antenna is identified, wherein the array antenna can comprise n antenna elements, where n is a positive integer of 2 or greater.

At 2820, determining a first dimension of a first antenna element in the antenna array is determined in conjunction with determining a second dimension of a second antenna element in the antenna array. The first dimension of the first antenna element and the second dimension of the second antenna element can be different. For example, the first dimension and the second dimension can be an edge length where the first antenna element and the second antenna element are square plates. In an embodiment, the first dimension can be an edge length=5.2 mm such that the first antenna element has an area of 5.2×5.2 mm. In an embodiment, the second dimension can be an edge length=5.0 mm such that the second antenna element has an area of 5.0×5.0 mm. In a conventional system, the first antenna element would be driven (e.g., in isolation) with a first operating frequency and the second antenna element would be driven (e.g., in isolation) with a second operating frequency. Accordingly, the first dimension of the first antenna element and the second dimension of the second antenna element are determined based upon a common frequency, wherein the common frequency (third frequency) is the required frequency identified at 2810. Further, one or more materials comprising the first antenna element and the second antenna element, along with any underlying structure (e.g., substrate, ground plane) can also be selected to obtain a common frequency that is different to the first operating frequency and the second operating frequency.

At 2830, an array antenna can be formed, wherein the array antenna includes the first antenna element and the second antenna element. In an embodiment, the array antenna can be fabricated to comprise a first plurality of antenna elements being dimensioned similar to the dimensioning of the first antenna element, and the array antenna further comprise a second plurality of antenna elements being dimensioned similar to the dimensioning of the second antenna element. Further, the antenna array can be fabricated with the materials selected for any of the first antenna element, the second antenna element, and/or the underlying structure. In an embodiment, the antenna elements in the first plurality of antenna elements and the antenna elements in the second plurality of antenna elements can be arranged in a "checkerboard" layout such that any antenna element in the first plurality of antenna elements is neighbored by antenna elements from the second plurality of antenna elements.

At 2840, the first antenna element (and the first plurality of antenna elements) and the second antenna element (and the second plurality of antenna elements) are excited with a third operating frequency. Owing to mutual coupling occurring between the first antenna element and the second antenna element, the frequency of signal transmission for the antenna array will be at the third operating frequency, rather than at either of the first operating frequency or the second operating frequency, such that any signals generated from the combination of first antenna element and the second antenna element have a frequency of the third operating frequency.

As shown at 2850, a cover layer can be applied over the array antenna formed at 2830. As previously described, addition of the cover layer to the array antenna can further enable operation under a fourth operating frequency. For example, a combination of antenna elements having dissimilar size in conjunction with the cover layer can enable the first operating frequency and second operating frequency to be replaced by a common fourth operating frequency.

FIG. 29 illustrates a methodology 2900 relating to utilizing dissimilar sub-wavelength apertures to facilitate EEMT at one or more frequencies which are unobtainable via conventional approaches.

At 2910, a required frequency of operation for unit cell is identified, wherein the unit cell comprises a first aperture and a second aperture.

At 2920, a first dimension (e.g., a first diameter, $d_1$) of the first aperture is determined in conjunction with determining a second dimension (e.g., a second diameter, $d_2$) of the second aperture. In an embodiment, $d_1=d_2$, while in another embodiment, $d_1 \neq d_2$. Further, a spacing (e.g., Λ) between the first aperture and the second aperture can be determined. In an embodiment, as previously described (e.g., per configuration 200), a plurality of first apertures can be combined (e.g., interspersed) with a plurality of second apertures. Under conventional operation, the first aperture would operate under excitation of a first excitation signal and the second aperture would operate under excitation of a second excitation signal. However, owing to a mutual coupling which can occur between the first aperture and the second aperture, the first aperture and second aperture can be simultaneously excited by a common, third excitation frequency, wherein the common frequency is the required frequency identified at 2910. Further, different materials can be utilized to form the first aperture, the first aperture opening, the second aperture, the second aperture opening, the plate in which the first and second apertures are formed, a first cover layer over the first and second apertures, a second cover layer over the first and second apertures, etc., to obtain a common frequency that is different to the first operating frequency and the second operating frequency.

At 2930, a unit cell can be formed comprising the first aperture(s) and second aperture(s), wherein sizing, materials, and/or placement of the first aperture(s) and second aperture(s) can be based upon the various dimensions defined at 2920.

At 2940, the first aperture and the second aperture can undergo excitation, e.g., by an excitation signal, wherein the excitation signal is different to an excitation respectively required to drive the first aperture and the second aperture. An EEMT frequency of transmission can be generated, whereby the EEMT frequency can be lowered as a function of EEMT effects generated based upon the first aperture having a different diameter to that of the second aperture, and the resulting mutual coupling.

As shown at 2950, a cover layer can be applied over the unit cell formed at 2930. As previously described, addition of the cover layer to the unit cell can further enable a shifting of the EEMT frequency. In an embodiment, the first aperture and the second aperture can have the same dimension, e.g., $d_1=d_2$.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A system comprising:

an array of elements comprising:

a first plurality of array elements, wherein a first array element in the first plurality of array elements having a first size, and the first array element when operated in isolation is driven by a first range of frequencies;

a second plurality of array elements, wherein a second array element in the second plurality of array elements having a second size, wherein the first size and second size are different, and the second array element when operated in isolation is driven by a second range of frequencies; and a feed network connected to the first plurality of array elements and the second plurality of array elements, wherein the first array element and the second array element are excited by a signal transmitted over the feed network, wherein the signal has a third range of frequencies, the third range of frequencies is different from the first range of frequencies and the second range of frequencies, and the third range of frequencies is a function of a mutual coupling effect between the first array element and the second array element in the array.

2. The system of claim 1, further comprising a cover layer, wherein the cover layer is formed over the array to cover the first plurality of array elements and the second plurality of array elements, whereby the cover layer is a dielectric.

3. The system of claim 2, wherein the cover layer causes a fourth frequency to be transmitted, wherein the fourth frequency is less than the first frequency and the second frequency.

4. The system of claim 1, wherein the first array element has a first width and the second array element has a second width that is different from the first width.

5. The system of claim 4, wherein the first width is less than the second width, the first array element having a smaller radiating area than the second array element, the first array element has a first resonant frequency and the second array element has a second resonant frequency, wherein the first resonant frequency is higher than the second resonant frequency.

6. The system of claim 4, wherein the first width is 5 mm and the first array element having a radiating area of 5 mm×5 mm, and the second width is 5.2 mm and the second array element having a radiating area of 5.2 mm×5.2 mm.

7. The system of claim 1, wherein the first plurality of array elements and the second plurality of array elements are arranged in a checkerboard layout, wherein an element in the first plurality of array elements is a square array and is neighbored on its four sides by array elements from the second plurality of array elements.

8. The system of claim 1, wherein the first array element and the second array element comprise a metallic material.

9. The system of claim 1, wherein the first plurality of array elements and the second plurality of array elements are located on a common ground plane.

10. The system of claim 9, wherein the ground plane is situated underneath a dielectric substrate.

11. An antenna comprising:

a first array element having a first size, the first array element when operated in isolation is configured to emit signals having a first frequency;

a second array element having a second size, wherein the first size and second size are different, the second array element when operated in isolation is configured to emit signals having a second frequency; and a feed network connected to the first array element and the second array element, wherein an excitation signal transmitted over the feed network has a third frequency, wherein the first array element and the second array element configured to simultaneously emit signals having the third frequency due to mutual coupling between the first array element and the second array element.

12. The antenna of claim 11, wherein the first array element has a first radiating surface area and the second array element has a second radiating surface area, wherein the first radiating surface area is smaller than the second radiating surface area.

13. The antenna of claim 12, the antenna further comprising:

a first plurality of antenna elements, the first plurality of antenna elements includes the first array element; and a second plurality of antenna elements, the second plurality of antenna elements includes the second array element, wherein the first plurality of antenna elements and the second plurality of antenna elements are arranged in a checkerboard layout, wherein an element in the first plurality of antenna elements is a square antenna and is neighbored on its four sides by antenna elements from the second plurality of antenna elements.

14. The antenna of claim 11, wherein the first array element is metallic, the second array element is metallic, the first array element and the second array element are located above a dielectric substrate having a ground plane.

* * * * *